US006278625B1

(12) United States Patent
Boyd

(10) Patent No.: US 6,278,625 B1
(45) Date of Patent: Aug. 21, 2001

(54) INVERTER CIRCUIT WITH MULTILAYER PIEZOELECTRIC TRANSFORMER

(75) Inventor: Clark Davis Boyd, Hampton, VA (US)

(73) Assignee: Face International Corp.

( * ) Notice: Subject to any disclaimer, the term of this patent is extended or adjusted under 35 U.S.C. 154(b) by 0 days.

(21) Appl. No.: 09/615,234

(22) Filed: Jul. 13, 2000

(51) Int. Cl.[7] .............................................. H02M 7/5387
(52) U.S. Cl. .................. 363/132; 310/318; 315/209 PZ
(58) Field of Search ............................. 363/132, 98, 97, 363/95; 310/318, 319, 314; 315/209 PZ; 323/299, 301

(56) References Cited

U.S. PATENT DOCUMENTS 6,087,757 * 7/2000 Honbo et al. ................... 310/316.01
6,151,232 * 11/2000 Furuhashi et al. ................... 363/97

\* cited by examiner

Primary Examiner—Peter S. Wong
Assistant Examiner—Gary L. Laxton
(74) Attorney, Agent, or Firm—Stephen E. Clark; David J. Boluc

(57) ABSTRACT

An inverter circuit is provided using a voltage converter having multiple layers of piezoelectric ceramic. More specifically, the present invention provides an inverter circuit for a Cold Cathode Fluorescent Lamp (CCFL) incorporating a multilayer piezoelectric transformer that uses the longitudinal resonant vibration mode for step-up voltage conversion. The transformer is driven by a FET half-bridge connected to an oscillator through dual current buffers, one current buffer being driven through and a level shifter and charge pump.

18 Claims, 9 Drawing Sheets

INVERTER CIRCUIT WITH MULTILAYER PIEZOELECTRIC TRANSFORMER

BACKGROUND OF INVENTION

1. Field of Invention

The present invention relates generally to an inverter circuit using voltage converter having multiple layers of piezoelectric ceramic. More specifically, the present invention relates to a Cold Cathode Fluorescent Lamp (CCFL) inverter circuit incorporating a multilayer piezoelectric transformer that uses the longitudinal resonant vibration mode for step-up voltage conversion.

2. Description of the Prior Art

Wire wound-type electromagnetic transformers have been used for generating high voltage in internal power circuits of devices such as televisions or fluorescent lamp ballasts. Such electromagnetic transformers take the form of a conductor wound onto a core made of a magnetic substance. Because a large number of turns of the conductor are required to realize a high transformation ratio, electromagnetic transformers that are effective, yet at the same time compact and slim in shape are extremely difficult to produce. Furthermore, in view of high frequency applications, the electromagnetic transformer has many disadvantages involving magnetic material of the electromagnetic transformer, such as sharp increase in hysteresis loss, eddy-current loss and conductor skin-effect loss. Those losses limit the practical frequency range of magnetic transformers to not above 500 kHz.

To remedy this and many other problems of the wire-wound transformer, piezoelectric ceramic transformers (or PTs) utilizing the piezoelectric effect have been provided in the prior art. In contrast to electromagnetic transformers, PTs have a sharp frequency characteristic of the output voltage to input voltage ratio, which has a peak at the resonant frequency. This resonant frequency depends on the material constants and thickness of materials of construction of the transformer including the piezoelectric ceramics and electrodes. Furthermore PTs have a number of advantages over general electromagnetic transformers. The size of PTs can be made much smaller than electromagnetic transformers of comparable transformation ratio, PTs can be made nonflammable, and produce no electromagnetically induced noise.

The ceramic body employed in PTs takes various forms and configurations, including rings, flat slabs and the like. Typical examples of a prior PTs are illustrated in FIGS. 1 and 2. This type of PT is commonly referred to as a "Rosen-type" piezoelectric transformer. The basic Rosen-type piezoelectric transformer was disclosed in U.S. Pat. No. 2,830,274 and numerous variations of this basic apparatus are well known in the prior art. The typical Rosen-type PT comprises a flat ceramic slab 20 appreciably longer than it is wide and substantially wider than it is thick. In the case of FIG. 1, the piezoelectric body 20 is in the form of a flat slab that is considerably wider than it is thick, and having greater length than width.

As shown in FIG. 1, a piezoelectric body 20 is employed having some portions polarized differently from others. A substantial portion of the slab 20, the generator portion 22 to the right of the center of the slab is polarized longitudinally, and has a high impedance in the direction of polarization. The remainder of the slab, the vibrator portion 21 is polarized transversely to the plane of the slab's face (in the thickness direction) and has a low impedance in the direction of polarization. In this case the vibrator portion 21 of the slab is actually divided into two portions. The first portion 24 of the vibrator portion 21 is polarized transversely in one direction, and the second portion 26 of the vibrator portion 21 is also polarized transversely but in the direction opposite to that of the polarization in the first portion 24 of the vibrator portion 21.

In order that electrical voltages may be related to mechanical stress in the slab 20, electrodes are provided. If desired, there may be a common electrode 28, shown as grounded. For the primary connection and for relating voltages at opposite faces of the low impedance vibrator portion 21 of the slab 20, there is an electrode 30 opposite the common electrode 28. For relating voltages to stresses generated in the longitudinal direction in the high impedance generator portion 22 of the slab 20, there is a secondary or high-voltage electrode 35 on the end of the slab for cooperating with the common electrode 28. The electrode 35 is shown as connected to a terminal 34 of an output load 36 grounded at its opposite end.

In the arrangement illustrated in FIG. 1, a voltage applied between the electrodes 28 and 30 of the low impedance vibrator portion 21 is stepped up to a higher voltage between the electrodes 28 and 35 in the high impedance generator portion for supplying the load 36 at a much higher voltage than that applied between the electrodes 28 and 30. The applied voltage causes a deformation of the slab thickness which results in proportionate changes in the x-y and y-z surface areas. More specifically, the Rosen PT is operated by applying alternating voltage to the drive electrodes 28 and 30, respectively. A longitudinal vibration is thereby excited in the low impedance vibrator portion 21 in the transverse effect mode (d31 mode). The transverse effect mode vibration in the low impedance vibrator portion 21 in turn excites a vibration in the high impedance generator portion 22 in a longitudinal effect longitudinal vibration mode (g33 mode). As the result, high voltage output is obtained between electrode 28 and 35. On the other hand, for obtaining output of step-down voltage, as appreciated, the high impedance portion 22 undergoing longitudinal effect mode vibration may be used as the input and the low impedance portion 21 subjected to transverse effect mode vibration as the output.

An inherent problem of such prior PTs is that they have relatively low power transmission capacity. This disadvantage of prior PTs relates to the fact that little or no mechanical advantage is realized between the vibrator portion 21 of the device and the driver portion 22 of the device. Because the driver and vibrator portions each is intrinsically a part of the same electroactive member, the transmission of energy between portions is limited to Poisson coupling. This inherently restricts the mechanical energy transmission capability of the device, which, in turn, inherently restricts the electrical power handling capacity of such devices.

Additionally, even under resonant conditions, because the piezoelectric voltage transmission function of Rosen-type PTs is accomplished by proportionate changes in the x-y and y-z surface areas (or, in certain embodiments, changes in the x-y and x'-y' surface areas) of the piezoelectric member, which changes are of relatively low magnitude, the power handling capacity of prior circuits using such piezoelectric transformers is inherently low. Because the power transmission capacity of such prior PTs is so low, it has become common in the prior art to combine several such transformers together into a multi-layer "stack" in order to achieve a greater power transmission capacity than would be achievable using one such prior transformer alone. This, of course, increases both the size and the manufacturing cost of the transformer.

In addition, with the typical Rosen transformer, it is generally necessary to alternately apply positive and negative voltages across opposing faces of the vibrator portion 21 of the member in order to "push" and "pull", respectively, the member into the desired shape. Even under resonant conditions, prior electrical circuits that incorporate such prior PTs are relatively inefficient, because the energy required during the first half-cycle of operation to "push" the piezoelectric member into a first shape is largely lost (i.e. by generating heat) during the "pull" half-cycle of operation. This heat generation corresponds to a lowering of efficiency of the circuit, an increased fire hazard, and/or a reduction in component and circuit reliability. In order to reduce the temperature of such heat generating circuits, the circuit components (typically including switching transistors and other components, as well as the transformer itself) are oversized, which reduces the number of applications in which the circuit can be utilized, and which also increases the cost/price of the circuit.

Also generally known are PTs polarized and vibrating in the thickness direction (i.e., vibrations are parallel to the direction of polarization of the layers). Illustrative of such thickness mode vibration PTs is the device of U.S. Pat. No. 5,118,982 to Inoue shown in FIG. 3. A thickness mode vibration PT typically comprises a low impedance portion 11 and a high impedance portion 12 stacked on each other. The low impedance portion 11 and the high impedance portion 12 of the thickness mode PT typically comprises a series of laminate layers of ceramic alternating with electrode layers. Each portion is composed of at least two electrode layers and at least one piezoelectric material layer. Each of the piezoelectric ceramic layers of the low impedance portion 11 and the ceramic layer of the high impedance portion 12 are polarized in the thickness direction (perpendicular to the plane of the interface between the ceramic layers). Every alternate electrode layer in each portion 11 or 12 may be connected to each other and to selected external terminals.

The thickness mode PT of FIG. 3 comprises a low impedance vibrator portion 11 including a plurality of piezoelectric layers 211 through 214 and a high impedance vibrator portion 12 including a piezoelectric layer 222, each of the layers being integrally laminated, and caused to vibrate in thickness-extensional mode. The low impedance portion 11 has a laminated structure which comprises multilayered piezoelectric layers 211 through 214 each being interposed between electrodes including the top surface electrode layer 201 and internal electrode layers 231 through 234. The high impedance portion 12 is constructed of the bottom electrode layer 202, an internal electrode layer 234 and a single piezoelectric layer 122 interposed between both electrode layers 202 and 234. Polarization in each piezoelectric layer is, as indicated by arrows, in the direction of thickness, respectively. In the low impedance portion 11, alternating piezoelectric layers are polarized in opposite directions to each other. The polarization in the high impedance portion 12 is also in the direction of thickness. The PT has a common electrode 234 to which one terminal 16 of each portion is connected. The total thickness of the PT of FIG. 3 is restricted to a half wavelength (lambda/2) or one full wavelength (lambda) of the drive frequency.

When an alternating voltage is applied to the electrode layers across the ceramic layer of the vibrator portion 11, a vibration is excited in the ceramic parallel to the direction of the polarization of the layers in the longitudinal vibration mode (d33 mode). This vibration of the low impedance portion 11 excites a vibration (g33 mode) in the high impedance portion 12. As the high impedance portion 12 vibrates, the g33 mode deformation of the high impedance portion 12 generates an electrical voltage across the electrodes of the high impedance portion 12. When operating the PT in the thickness-extensional mode with a resonance of lambda/2 mode (both end free fundamental mode) or lambda mode (both end-free secondary mode), the PT may operate in a typical frequency range of 1–10 MHz.

Referring now to FIG. 4: It is characteristic of PTs is that they preferably vibrate in a resonant mode predominantly along one plane or direction (i.e., radial or longitudinal planes, and thickness or longitudinal directions). A problem occurs with PTs when the ratio between the longitudinal or radial dimension is close to the thickness dimension. When the ratio between the height H and the radius R of the PT are close to unity, then radial or longitudinal mode resonant frequency and thickness mode resonant frequency are also close to each other. When the resonant frequencies are very close to each other, then the vibrations interfere with each other. This leads to aberrant vibrational modes that reduce the efficiency of these PTs.

Another problem with prior thickness mode PTs is that the thickness mode resonant frequency is too high for some applications.

Another problem with prior thickness mode and Rosen PTs is that they do not have a sufficient power transmission capacity for some applications.

Another problem with prior thickness mode and Rosen PTs is that the addition of layers makes the PT profile (height) too high to be placed within miniaturized circuits.

Another problem with prior thickness mode PTs is that the addition of layers makes the thickness dimension to close to the longitudinal or radial dimensions.

Another problem with prior thickness mode PTs is that the addition of layers to the PT does not significantly raise the power density of such devices and may increase capacitive and dielectric losses.

Accordingly, it would be desirable to provide a piezoelectric transformer design that has a higher power transmission capacity than similarly sized prior piezoelectric transformers.

It would also be desirable to provide a piezoelectric transformer that is smaller than prior piezoelectric transformers that have similar power transmission capacities.

It would also be desirable to provide a piezoelectric transformer that is a low profile (height to length ratio) as compared to prior piezoelectric transformers that have similar power transmission capacities.

It would also be desirable to provide a piezoelectric transformer with a significant difference between dimensions in thickness and longitudinal dimensions thereby reducing aberrant vibrational modes It would also be desirable to provide a piezoelectric transformer in which the "driver" portion of the device and the "driven" portion of the device are not the same electroactive element.

It would also be desirable to provide a piezoelectric transformer that develops a substantial mechanical advantage between the driver portion of the device and the driven portion of the device.

It would also be desirable to provide an inverter circuit incorporating a piezoelectric transformer of the character described.

SUMMARY OF THE INVENTION

According to the present invention, there is provided a piezoelectric transformer (PT) preferably operating at its natural (i.e. "resonant") frequency to convert a transformer input signal of a first character (i.e. voltage, frequency and current) to a transformer output signal of a second character (i.e. voltage, frequency and current). The disclosed PT efficiently accomplishes the described signal conversion by subjecting the input "driver" section of the PT to an alternating voltage (or in certain embodiments a pulsed voltage) which causes the input portion(s) to deform and vibrate, which in turn causes the output portion(s) to vibrate, which in turn causes the "driven" output portion of the PT to deform, and which in turn generates an output voltage at the driven section of the transformer.

The preferred embodiment of the invention provides a multi-layer piezoelectric transformer PT. The PT has a bar-shaped input PZT layer which is bonded to an insulation layer on one of its major faces. The input layer is electroded on both major faces and is poled between the electrodes perpendicular to the input layer's major faces (in the thickness direction). Application of an alternating voltage causes the input layer to expand and contract depending on the polarity of the voltage. In an alternate embodiment the input portion comprises multiple layers which may be operated in a "push-pull" mode using positive voltage input pulses.

The output layer of the PT comprises another bar-shaped layer of PZT bonded along a major face to the other side of the insulator layer. The output layer has electrodes on two opposing minor faces and a central electrode parallel to the minor faces. The output layer is poled in the direction perpendicular to the minor faces of the output layer, preferably towards the central electrode. A longitudinal deformation of the input layer causes a deformation of the output layer in the thickness direction, which generates the output voltage across the output electrodes.

Accordingly, it is an object the present invention to provide a PT design that has a higher power transmission capacity than similarly sized prior PTs.

It is another object of the present invention to provide a PT of the character described that has a smaller size and a lower profile than prior PTs that have similar power transmission capacities.

It is another object of the present invention to provide a PT of the character described in which the "driver" portion of the device and the "driven" portion of the device are not the same electro-active element.

It is another object of the present invention to provide a PT of the character described that develops a substantial mechanical advantage between the driver portion of the device and the driven portion of the device.

It is another object of the present invention to provide a PT of the character described that minimizes or eliminates interference between the longitudinal and thickness resonant vibrational modes.

It is another object of the present invention to provide an alternate embodiment of a multilayer PT of the character described that may be operated with positive only inputs.

It is another object of the present invention to provide an alternate embodiment of a multilayer PT of the character described that may be operated with a one hundred percent duty cycle.

It is another object of the present invention to provide a PT of the character described that is relatively less expensive to manufacture than prior PTs that perform comparable signal transformation functions.

It is another object of the present invention to provide a PT of the character described that vibrates with a lower frequency and may achieve a higher gain than prior PTs.

It is another object of the present invention to provide a PT of the character described and that is simpler to manufacture than prior PTs having a laminate structure.

It is another object of the present invention to provide a PT of the character described that has fewer losses due to capacitive and dielectric losses.

It is another object of the present invention to provide a PT that generates less heat than prior PTs, and thereby has reduced losses due to heat.

It is another object of the present invention to provide an inverter circuit incorporating a PT the character described.

It is another object of the present invention to provide an inverter circuit for lighting a CCFL incorporating a PT the character described.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DESCRIPTION OF THE PREFERRED EMBODIMENT

Figure 12:
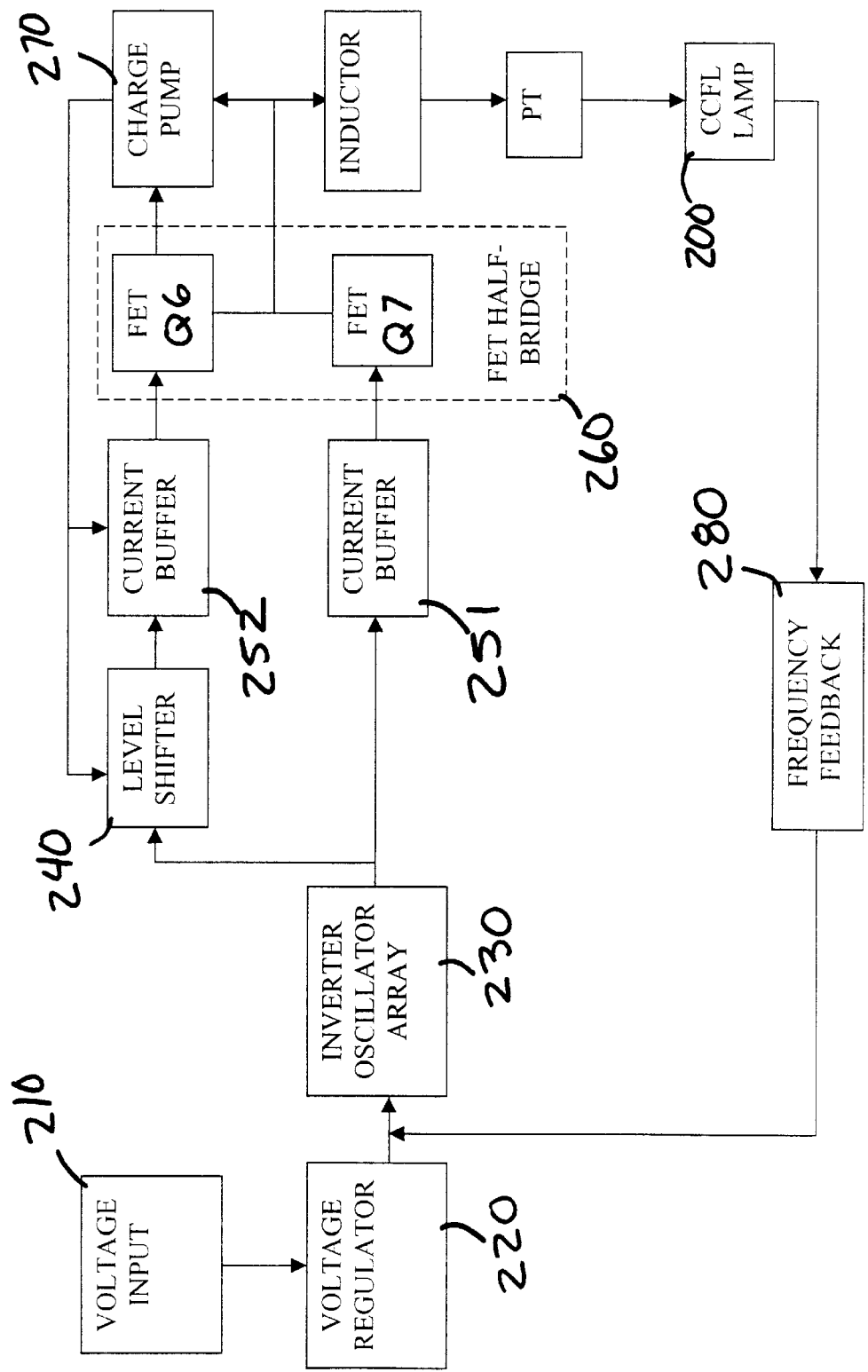
FIG. 12 is a block diagram showing the preferred circuit components for a drive circuit for lighting a Cold Cathode Fluorescent Lamp (CCFL) using one of the described transformers.

As will be described more fully herein below, according to the preferred embodiment of the present invention, there is provided an electric circuit that incorporates a piezoelectric transformer operating at its natural (i.e. "resonant") frequency to convert a transformer input signal of a first character (i.e. voltage, frequency and current) to a transformer output signal of a second character (i.e. voltage, frequency and current). The described circuit, which may be powered by a rectified AC source, but preferably by a DC source, efficiently accomplishes the described signal conversion by subjecting the driver (or, "input") section of the piezoelectric transformer to a voltage, which in turn causes the piezoelectric transformer to deform, which in turn causes the driven (or, "output") section of the piezoelectric transformer to deform, and which, in turn, generates an output voltage at the driven section of the transformer. As will be more fully described herein below, and as illustrated in FIG. 12, a resonant inverter circuit 6 is provided, for oscillating the piezoelectric transformer 5 at its resonant frequency and lighting a CCFL while minimizing energy losses in the voltage converter circuit.

It will be understood from the instant disclosure that a circuit constructed and operated in accordance with the principles of the present invention can be most advantageously practiced by using a multi-layer piezoelectric transformer that is capable of achieving high energy transmission. Accordingly, a description of the construction and characteristics of the preferred multi-layer piezoelectric transformer is given below. However, it should be understood that other, conventional, piezoelectric transformers may be used in modified embodiments of the invention to advantageously optimize the operational (i.e. voltage conversion and power transmission) performance of such conventional transformers.

In a preferred embodiment of the invention, which comprises a multi-layer piezoelectric transformer 1 that is capable of achieving high power transmission, a voltage converter circuit provides power-supply and control for a gas discharge lamp 200, particularly a Cold Cathode Fluorescent Lamp (CCFL). However, it should be understood that the voltage conversion circuit of the present invention may be advantageously used for many applications, and the scope of the invention, therefore, should not be limited by the nature or description of the "load" that may be applied to the transformer's output.

Multi-Layer Piezoelectric Transformer

In the present invention, a multilayer piezoelectric transformer is provided using the longitudinal resonant vibrations for step-up voltage conversion applications. Typical PTs utilize a multilayer construction in attempting to provide greater voltage gain and power to circuit applications. The transformation ratio is typically substantially proportional to the square of impedance ratio between the input and output portions. Therefore, attempts have been made in prior PTs to increase gain by making the output layer thicker. There is however a practical limit to the efficacy of adding ceramic layers and after a certain point, additional layers do not contribute to the gain of the PT. Furthermore, added layers may bring the ratio between the thickness dimension and the longitudinal or radial dimension too close to unity. The present invention allows for increased gain by increasing the impedance ratio between the output and input sections of the PT without unduly increasing the thickness dimension.

A high voltage PT is provided which has high voltage output while still providing a low profile device. A low profile device is necessary because as the ratio of the thickness to the diameter or length of a PT approaches 1, the planar/radial resonance mode and the thickness resonant mode vibrations interfere with each other. The present configuration of PT minimizes the interference of resonant modes with the following design.

Figure 1:
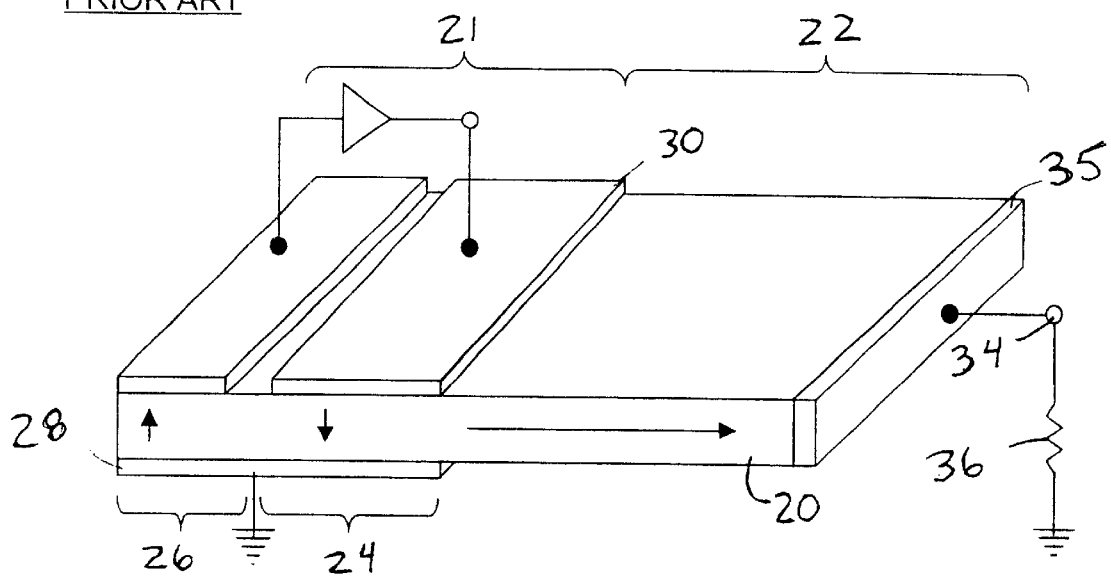
FIG. 1 is a partially schematic perspective view of a typical Rosen type piezoelectric transformer of the prior art.
Figure 2:
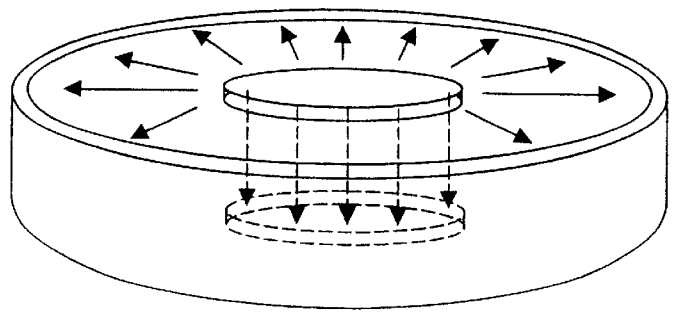
FIG. 2 is a perspective view of another example of a Rosen type piezoelectric transformer of the prior art.
Figure 3:
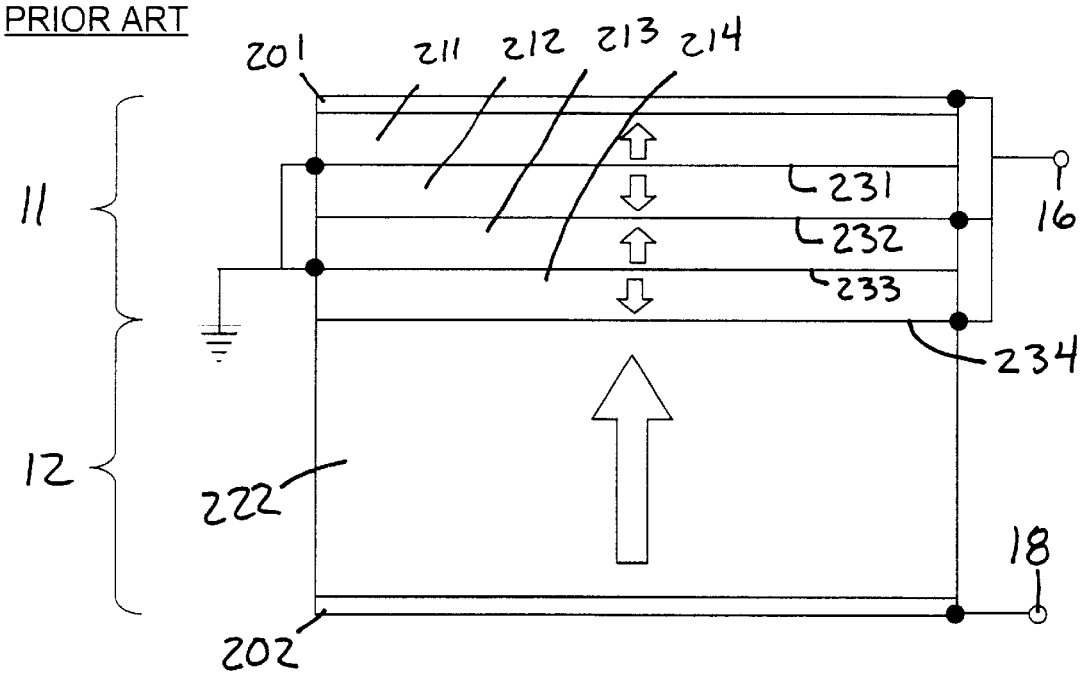
FIG. 3 is a perspective view of a typical multi-layer thickness mode vibration piezoelectric transformer of the prior art.
Figure 4:
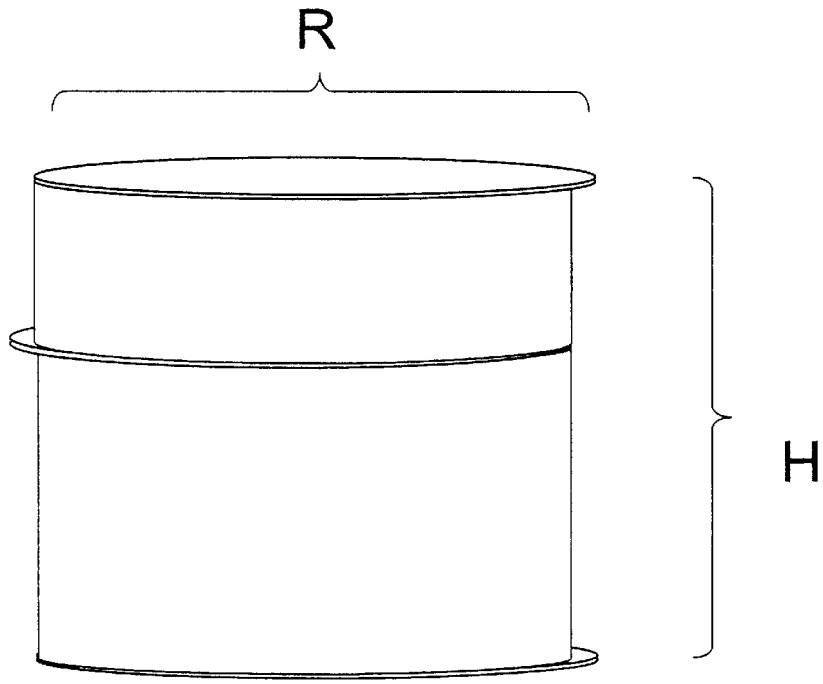
FIG. 4 is a perspective view of a cylindrical piezoelectric transformer having a radius to height ratio close to unity.
Figure 5:
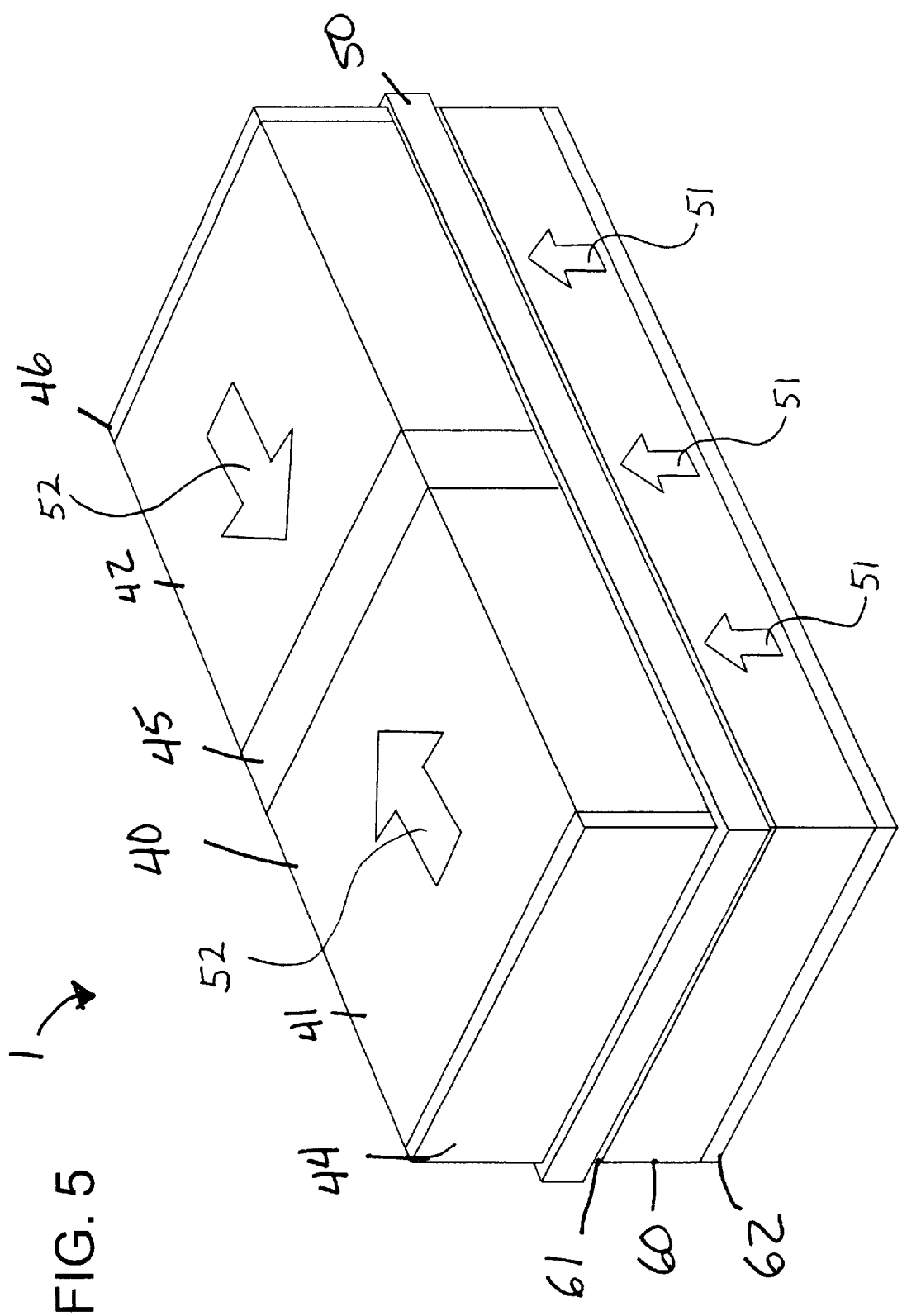
FIG. 5 is a perspective view of the preferred embodiment of the piezoelectric transformer of the present invention with a bar-shaped configuration.

Referring now to FIG. 5: The PT 1 comprises an input layer 60 comprising a thin layer of an electroactive material, preferably PZT with electrodes (silver and/or nickel) electro-deposited thereon. Preferably, when restricted to a specified width of transformer, the input layer 60 is rectangular or bar-shaped rather than circular in order to take advantage of the lower resonant frequency longitudinal mode rather than the radial mode vibration. The input layer 60 is also preferably substantially longer than it is wide, (for example 1.5 times, and preferably 3 or more times as long), and substantially wider than it is thick (for example 1.5 or more times wider). These dimensions ensure that the device's resonant frequency is the lower frequency longitudinal mode related to the length of the device rather than to the width or thickness of the device.

Electrodes 61 and 62 are provided on the two major faces of the input layer 60. The electrodes 61 and 62 preferably each comprise a copper foil. Bonding of the input layer 60 to the electrodes 61 and 62 is preferably achieved with "Ciba-Geigy AV118" (CIBA) adhesive as manufactured by Ciba Specialty Chemicals Corporation, N.A. of East Lansing, Mich. The electrodes 61 and 62 may also be electro-deposited or vapor deposited on the major faces of the input layer 60, or alternatively may be fired or cofired onto the faces of the input ceramic layer 60.

The input layer 60 is polarized in the thickness direction, i.e., in a direction perpendicular to the input electrodes 61 and 62 on the major faces of the input layer 60 as indicated by arrows 51. This polarization is such that when a voltage is applied across the input electrodes 61 and 62, the input layer 60 will deform in the longitudinal direction, i.e., a d31 mode deformation in a direction parallel to the planes of the electrodes 61 and 62. An electrode 61 of the input layer 60 is bonded to an insulating layer 50, preferably comprising a layer of alumina. The electrode 61 is preferably bonded to the insulating layer 50 using CIBA adhesive. The alumina layer 50 prevents the input electrodes 61 or 62 from contacting any of the output layer 40 or the output electrodes 44, 45 and 46. The insulator layer 50 should extend at least to the edges of the input electrode 61 or 62 to which it is bonded, and preferably extends past the edges to prevent any arcing between the input layer 60 or input electrodes 61 and 62 and the output layer 40 and its electrodes 44, 45 and 46.

The output layer 40 of the PT 1 comprises another rectangular bar-shaped layer of electroactive material, preferably PZT. Preferably, the thickness of the output layer 40 is relatively greater than the thickness of the input layer 60. The output layer 40 is bisected by a central output electrode 45 thus defining two substantially equal portions 41 and 42 of the output layer 40. In the preferred embodiment of the invention, the output layer 40 comprises a single bar of PZT with a central electrode bonded to and/or wrapped around the central circumferential surface of the bar. However, the output layer 40 may alternatively comprise two separate pieces 41 and 42 of PZT which are bonded at a minor face to the central electrode 45. Two outboard output electrodes 44 and 46 are bonded on the two minor faces of the output layer 40 that are parallel to the central electrode 45. The electrodes 44, 45 and 46 preferably comprise copper foil bonded to the output layer 40 using CIBA adhesive. The output layer 40 is also bonded, preferably using CIBA adhesive on a major face to the insulating alumina layer 50. Thus, in the preferred embodiment of the invention, the central electrode 45 is essentially a conductive band that wraps around the output layer 40 between the output portions 41 and 42, and in the alternative embodiment of the invention the central electrode 45 actually physically separates the two output portions 41 and 42 of the output layer 40 from each other.

Each portion 41 and 42 of the output layer 40 is polarized between its respective outboard electrode 44 or 46 towards the central electrode 45. This provides for an output layer 40 with output portions 41 and 42 that are poled longitudinally (parallel to the major face) with respect to the input layer 60. The output portions 41 and 42 are poled in the thickness direction with respect to their respective output electrodes 44 and 45 or 46 and 45. The output portions 41 and 42 are preferably both poled towards the central output electrode 45 as indicated by arrows 52 i.e., the positive poling potential is applied at the central electrode 45. With this poling, when a voltage is applied between electrode 44 and 45 or between electrodes 46 and 45, the output portion 41 or 42 between those electrodes will expand or contract (depending on the polarity) between the electrodes and parallel to the direction of poling (d33 deformation). Conversely, when the output portions 41 and 42 of the output layer 40 are strained under a compressive or tensile force, a voltage is generated between the output electrodes 44 and 45 and electrodes 45 and 46.

Figure 6:
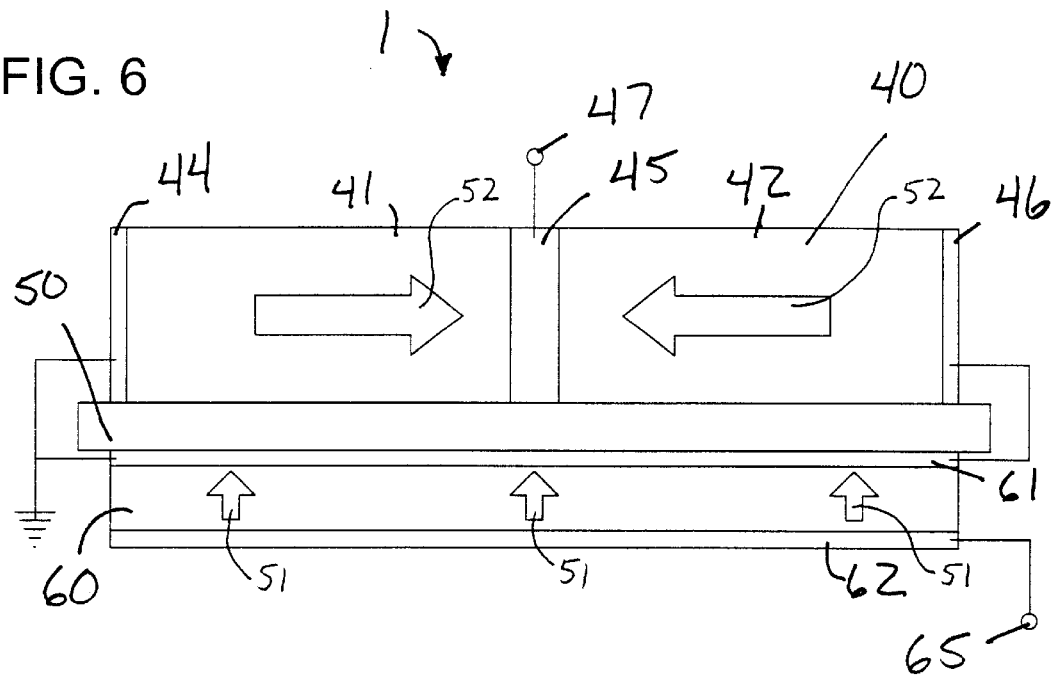
FIG. 6 is a partial schematic elevation view of the piezoelectric transformer of FIG. 6 showing the details of construction and showing the preferred electrical connections.

Referring now to FIG. 6: In the preferred embodiment of the invention, the outboard input electrode 62 is connected to an input terminal 65. The input electrode 61 bonded to the insulator 50 is connected to ground as are the outboard output electrodes 44 and 46. Output electrode 45 is connected to output terminal 47. In operation, application of a voltage of a first polarity to input terminal 65 across the electrodes 61 and 62 of the input layer 60 causes a longitudinal d31 deformation (contraction) of the ceramic layer 60, which in turn deforms (contracts) the attached insulator layer 50 and output layer 40. The thickness deformation (contraction) of the output portions 41 and 42 of the output layer 40 piezoelectrically generates an output voltage of a first polarity in the g33 mode, between the grounded output electrodes 44 and 46 and the central output electrode 45, which is connected to output terminal 47. Conversely, application of a second voltage of a second opposite polarity to input terminal 65 across the electrodes 61 and 62 of the input layer 60 causes a longitudinal d31 mode deformation (expansion) of the ceramic layer 60, which in turn deforms (expands) the attached insulator layer 50 and output layer 40. The thickness deformation (expansion) of the output portions 41 and 42 of the output layer 40 piezoelectrically generates an output voltage of a second opposite polarity in the g33 mode, between the grounded output electrodes 44 and 46 and the central output electrode 45, which is connected to output terminal 47. Thus, application of an alternating voltage to the input layer 60 causes the input layer 60 to deform (in the d31 mode), which causes the attached insulator 50 and output layers 40 to deform (in the g33 mode), thereby generating an alternating output voltage.

Figure 7:
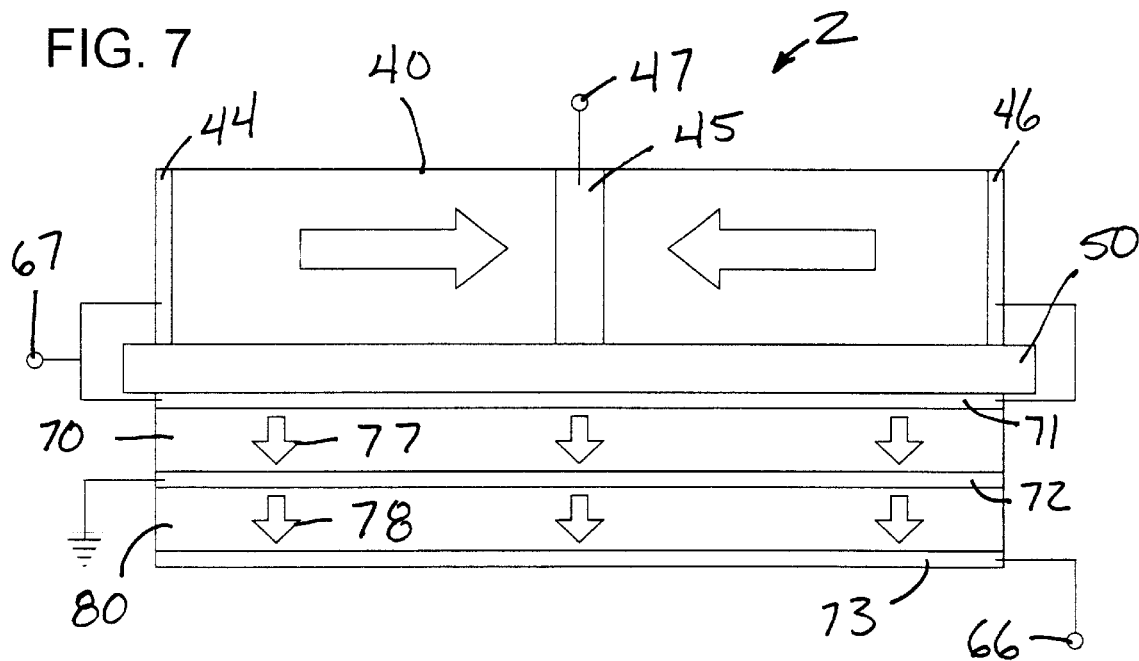
FIG. 7 is a partial schematic elevation view of an alternate embodiment of a piezoelectric transformer using two input layers and showing the preferred pulsed DC input electrical connections.

Referring now to FIG. 7: An alternate embodiment of the invention comprises another multi-layer PT 2, which is configured with a first input ceramic layer 70, a second input ceramic layer 80 and a relatively thicker output layer 40. That is, the thickness of each of the input layers 70 and 80 is preferably thinner than the output layer 40. Each input layer 70 and 80 comprises a thin bar-shaped layer of electroactive material, preferably PZT with electrodes (silver and/or nickel) electro-deposited thereon. Each input layer 70 and 80 is bonded along a major face to a common electrode 72 between them. A first input electrode 71 is bonded to the remaining major face of the first input ceramic layer 70 and a second input electrode 73 is bonded to the remaining major face of the second input ceramic layer 80. The input electrodes 71, 72 and 73 preferably comprise copper foil bonded to the major faces of the input layers 70 and 80 using CIBA adhesive. The electrodes 71, 72 and 73 may also be electro-deposited or vapor deposited on the major faces of the input layers 70 and 80, or alternatively may be fired or cofired onto the faces of the input ceramic layers 70 and 80. The construction of the output layer 40 of the PT 2 is essentially identical to the output layer of the PT 1 described above and shown in FIGS. 5 and 6.

The first input electrode 71 is bonded to a first major face of an insulator layer 50, preferably comprising a thin layer of alumina. On the other major face of the insulator layer 50 is bonded the output layer 40. The insulator layer 50 extends at least to the edges of the input electrode 71 to which it is bonded, but may extend past the edges of the input layers 70 and 80 and output layer 40. The insulator layer 50 prevents electrical shorting or arcing between the input layer components (electrodes 71 and 73 and ceramic layer 70 or 80) and the output components (electrodes 44, 45 and 46 and ceramic layer 40, and particularly the central high voltage electrode 45).

Each of the input layers 70 and 80 is poled in the thickness direction so that they deform longitudinally, i.e., parallel to the major faces of the input layers 70 and 80, when a voltage is applied to a layer 70 or 80. As shown by arrows 77 and 78, the input layers 70 and 80 are poled in the same direction with respect to each other. The directions of polarization of the input layers 70 and 80 are opposite however with respect to their respective input electrodes 71 or 73 and the common electrode 72. Thus, when a positive voltage pulse is applied across the electrodes 71 and 72 of the first input layer 70 it will contract, but when the same positive voltage pulse is applied across the electrodes 73 and 72 of the second input layer 80, the second input layer will 80 expand. Alternately, a negative voltage may be applied the respective electrodes 71 and 72 or electrodes 72 and 73 of the first and second input layers 70 and 80 to have the reverse effect.

Still referring to FIG. 7: In operation, when a positive voltage pulse is applied to input terminal 67 and thereby to the first input layer 70, the first input layer 70 will expand in the d31 mode. When the first input layer 70 expands, it causes the attached output layer 40 to expand with it in the g33 mode. The expansion of the output layer 40 generates a voltage of a first polarity across the output electrodes 44, 45 and 46. When a positive voltage pulse is applied to the second input terminal 66 and thereby the second input layer 80, the second input layer 80 will contract in the d31 mode. When the second input layer 80 contracts, it causes the attached first input layer 70 and output layer 40 to contract with it in the g33 mode. The contraction of the output layer 40 generates a second output voltage (of opposite polarity than the first output voltage) across the output electrodes 44, 45 and 46. Thus, one input layer 70 pushes the layers 80, 50 and 40 in one direction during the first half cycle of operation and the other input layer 80 pulls the layers 70, 50 and 40 back during the second half cycle of operation resulting in a 100% duty cycle. The pulsed positive voltage inputs cause the input layers 70 and 80 to deform in the d31 mode, and pull and push the output layer 40 in the g33 mode to generate an alternating voltage across the electrodes 44 and 45, and 46 and 45 of the output layer 40.

Figure 8:
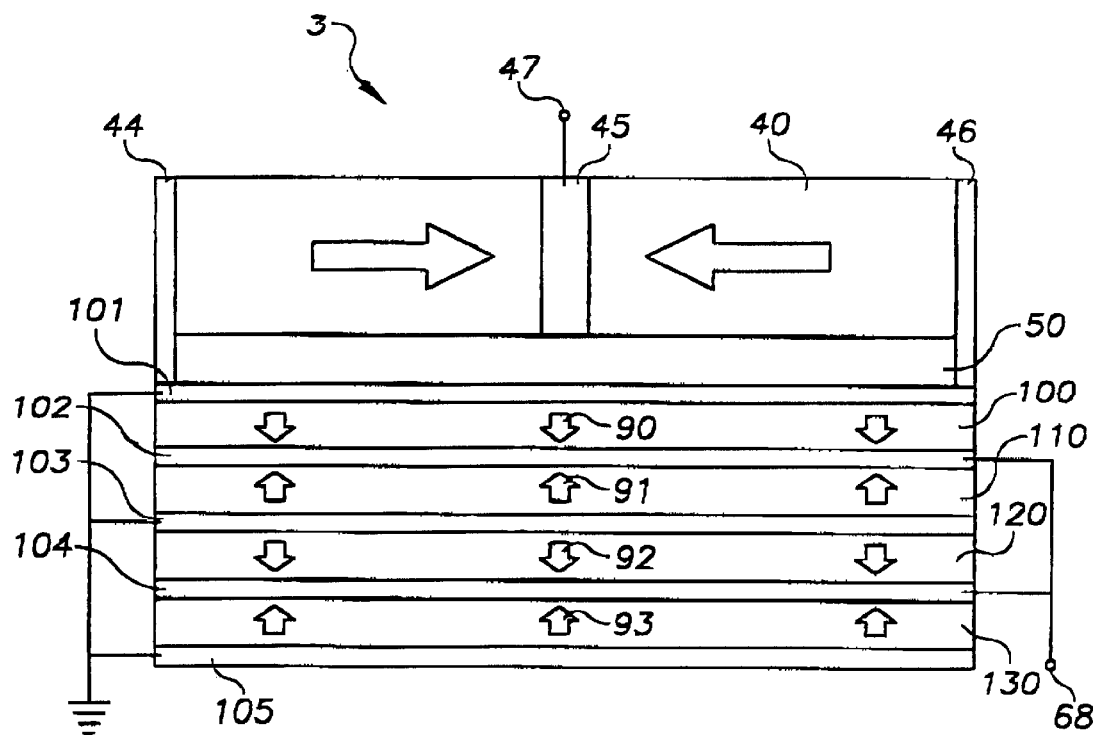
FIG. 8 is a partial schematic elevation view of an alternate embodiment of a piezoelectric transformer using 4 input layers and showing AC input electrical connections.

Referring now to FIG. 8: In yet another alternate embodiment of the invention, a multi-layer PT 3 is configured with a first input ceramic layer 100, a second input ceramic layer 110, a third input layer 120 and a fourth input layer 130, an insulator layer 50 and a relatively thicker output layer 40. Each input layer 100, 110, 120 and 130 comprises a thin bar-shaped layer of electroactive material, preferably PZT with electrodes (silver and/or nickel) electro-deposited thereon. Each input layer is bonded along each major face to an electrode, preferably comprising copper foil bonded using CIBA adhesive. Preferably, a first input electrode 101 is bonded on a first major face of the first input ceramic layer 100, and a second input electrode 102 is bonded on the remaining major face of the first input ceramic layer 100. The second input ceramic layer 110 is bonded on a major face to the second input electrode 102, and a third input electrode 103 is bonded on the remaining major face of the second input ceramic layer 110. The third input ceramic layer 120 is bonded on a major face to the third input electrode 103, and a fourth input electrode 104 is bonded on the remaining major face of the third input ceramic layer 120. The fourth input ceramic layer 130 is bonded on a major face to the fourth input electrode 104, and a fifth input electrode 105 is bonded on the remaining major face of the fourth input ceramic layer 130. Preferably, electrodes 102 and 104 are connected to input terminal 68 and electrodes 101, 103 and 105 are connected to a common ground as shown in FIG. 8. Alternatively, electrodes 101, 103 and 105 may be connected to input terminal 68 and electrodes 102 and 104 may be connected to a common ground. As an alternative to bonding the electrodes 101, 102, 103, 104 and 105 to the input layers 110, 120, and 130, using CIBA adhesive, the electrodes 101, 102, 103, 104 and 105 may be electro-deposited or vapor deposited on the major faces of the input layers 110, 120, and 130, or alternatively may be fired or cofired onto the faces of the input ceramic layers 100, 110, 120 and 130. The construction of the output layer 40 of the PT 3 is essentially identical to the output layer of the PT 1 described above and shown in FIGS. 5 and 6.

The first input electrode 101 is bonded to a first major face of an insulator layer 50, preferably comprising a thin layer of alumina and preferably using CIBA adhesive. On the other major face of the insulator layer 50 is bonded the output layer 40 preferably using CIBA adhesive. The outermost input electrodes 101 and 105 of input layers 100 or 130, respectively, are ground referenced and the outer electrodes 44 and 46 of the output layer 40 are also ground referenced. Since the outermost input electrodes 101 and 105 are ground referenced and the outer electrodes 44 and 46 of the output layer 40 are also ground referenced, these electrodes 44, 46 and 101 or 105 may come into electrical contact with one another without disadvantageously affecting the operation of the PT 3, and therefore the insulator layer need not extend past the electrodes 101 or 105 of the input layers 100 and 130, respectively. The insulator layer 50 may in the alternative extend to the edges of the input electrode 101 to which it is bonded, and may also extend past the edges of the input layers 100, 110, 120 and 130 and output layer 40. The insulator layer 50 prevents electrical shorting or arcing between the input layer electrode 101 and the output layer central high voltage electrode 45.

Each of the input layers 100, 110, 120 and 130 is poled in the thickness direction so that they deform longitudinally, i.e., in the d31 mode parallel to the major faces of the input layers 100, 110, 120 and 130, when a voltage is applied to a layer 100, 110, 120 or 130. As shown by arrows 90 and 92, the input layers 100 and 120 are poled in the same direction with respect to each other. Also, as shown by arrows 91 and 93, the input layers 110 and 130 are poled in the same direction with respect to each other. Input layers 100 and 110 are poled in opposite directions with respect to each other. However, input layers 100 and 110 are actually poled in the same direction with respect to the central input electrode 102 (i.e., towards the central input electrode 102). Likewise, input layers 120 and 130 are poled in opposite directions with respect to each other. However, input layers 120 and 130 are actually poled in the same direction with respect to central input electrode 104 (i.e., towards central input electrode 104). Thus, when an input voltage of a first polarity is applied to input electrode 102, ceramic layers 100 and 110 will deform longitudinally in the same direction (piezoelectrically contracting in the d31 mode). When a second input voltage of an opposite polarity is applied to input electrode 102, ceramic layers 100 and 110 will deform longitudinally in the same direction (piezoelectrically expanding in the d31 mode). Furthermore, when an input voltage of a first polarity is applied to input electrode 104, ceramic layers 120 and 130 will deform longitudinally in the same direction (piezoelectrically contracting in the d31 mode). When a second input voltage of an opposite polarity is applied to input electrode 104, ceramic layers 120 and 130 will deform longitudinally in the same direction (piezoelectrically expanding in thew d31 mode). Since only one voltage source is being applied to input terminal 68, both input electrodes 102 and 104 will have the same polarity voltage applied to them and all the ceramic input layers 100, 110, 120 and 130 will piezoelectrically expand or contract simultaneously. Thus, it will be understood that application of an alternating voltage to input terminal 68 will cause all the ceramic layers 100, 110, 120 and 130 to cyclically expand and contract in the d31 mode together at the frequency of the applied voltage.

In operation the input electrodes 102 and 104 are connected to input terminal 68. The input electrode 101 bonded to the insulator 50 is connected to ground as are input electrodes 103 and 105 and the outboard output electrodes 44 and 46. Output electrode 45 is connected to output terminal 47. In operation, application of a voltage of a first polarity to input terminal 68 across the electrodes 102 and 101, 102 and 103, 104 and 103 and 104 and 105 of the input layers 100, 110, 120 and 130 respectively causes a longitudinal d31 mode deformation (contraction) of the ceramic layers 100, 110, 120 and 130, which in turn deforms (contracts) the attached insulator layer 50 and output layer 40 in the g33 mode. The thickness g33 mode deformation (contraction) of the output portions 41 and 42 of the output layer 40 piezoelectrically generates an output voltage of a first polarity between the output grounds 44 and 46 and the central output electrode 45 connected to output terminal 47. Conversely, application of a second voltage of a second opposite polarity to input terminal 68 across the electrodes 102 and 101, 102 and 103, 104 and 103 and 104 and 105 of the input layers 100, 110, 120 and 130 respectively causes a longitudinal d31 mode deformation (expansion) of the ceramic layers 100, 110, 120 and 130, which in turn deforms (expands) the attached insulator layer 50 and output layer 40 in the g33 mode. The thickness g33 mode deformation (expansion) of the output portions 41 and 42 of the output layer 40 piezoelectrically generates an output voltage of a second opposite polarity between the output grounds 44 and 46 and the central output electrode 45 connected to output terminal 47. Thus, application of an alternating voltage to the input layers 100, 110, 120 and 130 causes the input layers 100, 110, 120 and 130 to deform (in the d31 mode) which causes the attached insulator 50 and output layers 40 to deform (in the g33 mode), thereby generating an alternating output voltage.

Figure 9:
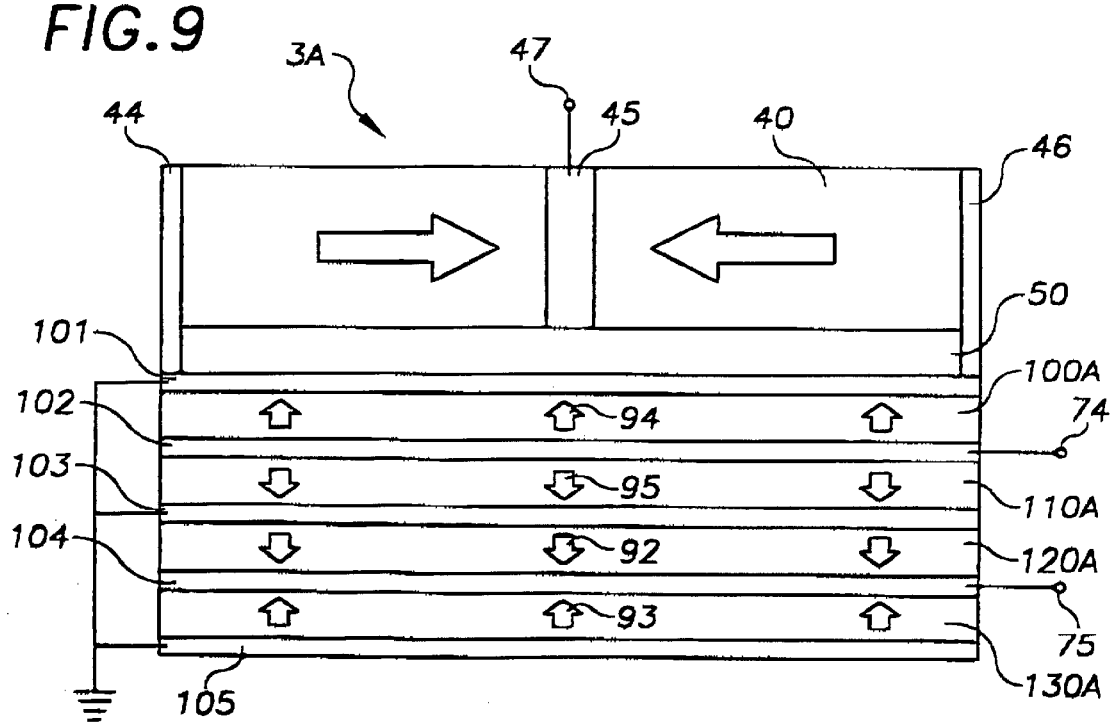
FIG. 9 is a partial schematic elevation view of an alternate embodiment of a piezoelectric transformer using 4 input layers and showing pulsed DC input electrical connections.

Referring now to FIG. 9: Alternatively, the transformer 3A may be configured to be driven by positive voltage pulses in a push-pull mode by simply reverse poling two adjacent layers and reconfiguring the input terminals. The transformer of FIG. 9 is identical to the PT 3 of FIG. 8 except that the first two input layers 100A and 110A are pole away from (rather than towards) the electrode 102 between the input layers 100A and 110A, as shown by arrows 94 and 95. Also, rather than the common input terminal 68 as in FIG. 8, separate input terminals 74 and 75 are provided. Specifically, input terminal 74 is connected to the electrode 102 commonly shared by the first two input layers 100A and 110A, and terminal 75 is connected to the electrode 104 commonly shared by the second two input layers 120A and 130A. Thus, the input layers 100A and 110A are poled away from their common input electrode 102 and the other input layers 120A and 130A are poled towards their common input electrode 104. Thus, when a positive voltage pulse is applied across pairs of electrodes 102 and 101, and 102 and 103 of the first pair of input layers 100A and 110A they will expand in the d31 mode, but when the same positive voltage pulse is applied across pairs of electrodes 104 and 103, and 104 and 105 of the second pair of input layers 120A and 130A, input layers 120A and 130A will contract in the d31 mode. Alternately, a negative voltage may be applied the respective electrodes to have the reverse effect.

In operation, when a positive voltage pulse is applied to input terminal 74 and thereby across the first and second input layers 100A and 110A, and the layers 100A and 110A expand in the d31 mode. When the first pair of input layers 100A and 110A expand, it causes the attached output layer 40 to expand with them in the g33 mode. The g33 mode expansion of the output layer 40 generates a voltage of a first polarity across the output electrodes 44, 45 and 46. When a positive voltage pulse is applied to the second input terminal 75 and thereby the third and fourth input layers 120A and 130A, the layers 120A and 130A contract in the d31 mode. When the second pair of input layers 120A and 130A contract, it causes the attached output layer 40 to contract with them in the g33 mode. The g33 mode contraction of the output layer 40 generates a second output voltage (of opposite polarity than the first output voltage) across the output electrodes 44, 45 and 46. Thus one pair of input layers 100 and 110 piezoelectrically expands in the d31 mode and pushes the other layers 120A, 130A, 50 and 40 in one direction during the first half cycle of operation and the other pair of input layers 120A and 130A piezoelectrically contracts in the d31 mode and pulls the other layers 100A, 110A, 50 and 40 back during the second half cycle of operation resulting in a 100% duty cycle. The pulsed positive voltage inputs to the input layers 100A, 110A, 120A and 130A cause d31 mode deformations that pull and push the output layer 40 in the g33 mode to generate an alternating voltage across the electrodes 44 and 45, and 46 and 45 of the output layer 40.

Figure 10:
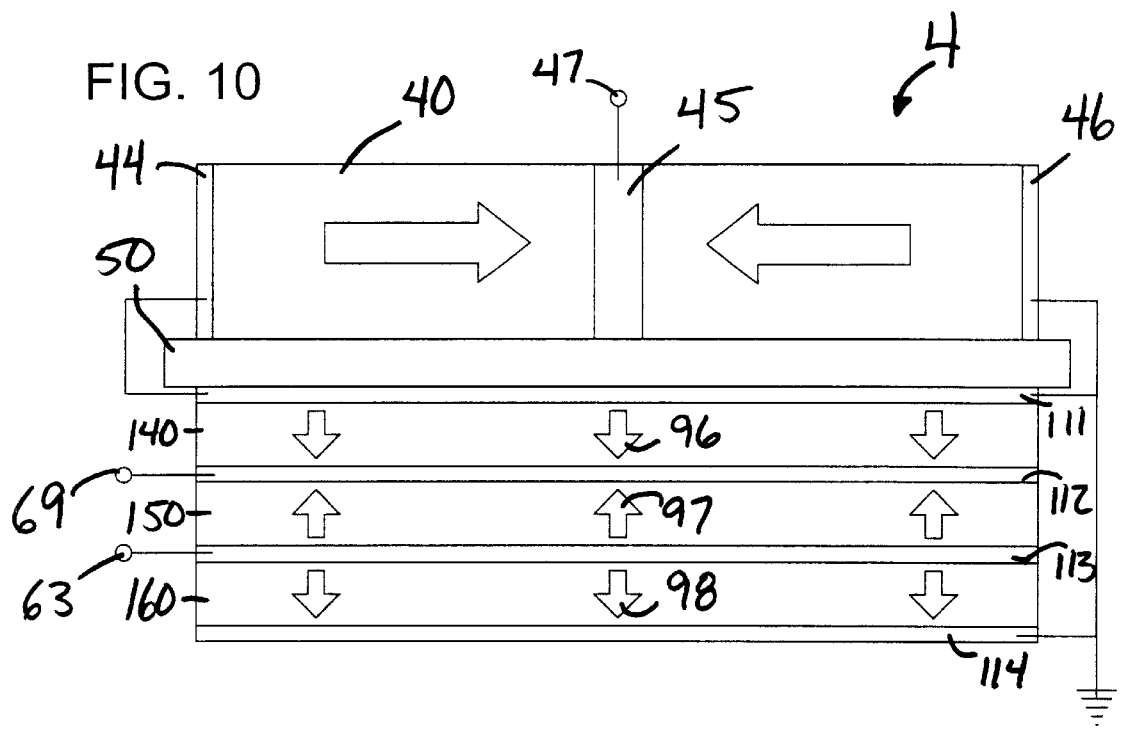
FIG. 10 is a partial schematic elevation view of an alternate embodiment of a piezoelectric transformer using three input layers and showing pulsed DC input electrical connections.

Referring to FIG. 10: An alternate embodiment of the invention comprises another multi-layer PT 4 which is configured with three input layers 140, 150 and 160, an insulator layer 50 and a relatively thicker output layer 40. Each input layer 140, 150 and 160 comprises a thin bar-shaped layer of electroactive material, preferably PZT that has electrodes (silver and/or nickel) electro-deposited thereon. Each input layer 140, 150 and 160 is bonded along each major face to an electrode, preferably copper foil bonded using CIBA adhesive. More specifically, a first input electrode 111 is bonded on a first major face of the first input ceramic layer 140, and a second input electrode 112 is bonded on the remaining major face of the first input ceramic layer 140. The second input ceramic layer 150 is bonded on a major face to the second input electrode 112, and a third input electrode 113 is bonded on the remaining major face of the second input ceramic layer 140. The third input ceramic layer 160 is bonded on a major face to the third input electrode 113, and a fourth input electrode 114 is bonded on the remaining major face of the third input ceramic layer 160. Preferably, electrode 112 is connected to input terminal 69 and electrode 113 is connected to input terminal 63, and electrodes 111 and 114 are connected to a common ground. In the alternative, the electrodes 111, 112, 113 and 114 may be electro-deposited or vapor deposited on the major faces of the input layers 140, 150, and 160, or alternatively may be fired or cofired onto the faces of the input ceramic layers 140, 150 and 160. The construction of the output layer 40 of the PT 4 is essentially identical to that of the output layer of the PT 1 described above and shown in FIGS. 5 and 6.

The first input electrode 111 is bonded a first major face of an insulator layer 50, preferably comprising a thin layer of alumina bonded using CIBA adhesive. On the other major face of the insulator layer 50 is bonded the output layer 40, also preferably using CIBA adhesive. The outermost input electrodes 111 and 114 of input layers 140 and 160 are ground referenced and the outer electrodes 44 and 46 of the output layer 40 are also ground referenced. The insulator layer 50 may extend to the edges of the input electrode 111 to which it is bonded, and may also extend past the edges of the input layers 140, 150 and 160 and output layer 40. The insulator layer 50 prevents electrical shorting or arcing between the input layer electrodes 111 or 114 and the output layer central high voltage electrode 45. In the alternative, since the outermost input electrodes 111 and 114 are ground referenced and the outer electrodes 44 and 46 of the output layer 40 are also ground referenced, these electrodes 44, 46 and 111 or 114 may come into electrical contact with each other without disadvantageously affecting the operation of the PT 4, and therefore the insulator layer need not extend past the electrodes 111 or 114 of the input layer 140 or 160.

Each of the input layers 140, 150 and 160 is poled in the thickness direction so that they deform longitudinally in the d31 mode, i.e., parallel to the major faces of the input layers 140, 150 and 160, when a voltage is applied to a layer 140, 150 or 160. As shown by arrows 96 and 98, the input layers 140 and 160 are poled in the same direction with respect to each other. In addition, as shown by arrow 97, the input layer 150 is poled in the opposite direction with respect to layers 140 and 160. However, input layer 150 is actually poled in the same direction as input layer 140 with respect to the input electrode 112 (i.e., towards the input electrode 112) between the layers 140 and 150. Also, input layer 150 is poled in the same direction as input layer 160 with respect to the input electrode 113 (i.e., away from the input electrode 113) between the layers 150 and 160.

Thus, when a positive voltage pulse is applied to input terminal 69, the voltage will be applied across electrodes 112 and 111 of input layer 140 which will expand in the d31 mode and across electrodes 112 and 113 of input layer 150 which will also expand in the d31 mode. When the same positive voltage pulse is applied to input terminal 63, the voltage will be applied across electrodes 113 and 114 of input layer 160 which will contract in the d31 mode and across electrodes 113 and 112 of input layer 150 which will also contract in the d31 mode. Alternately, a negative voltage pulse may be applied the respective electrodes 112 and 111, 112 and 113, 113 and 114 and 113 and 112, of the three input layers 140, 150 and 150 to have the reverse effect.

In operation, when a positive voltage pulse is applied to the first input terminal 69, input layers 140 and 150 expand in the d31 mode. When the input layers 140 and 150 expand, the attached output layer 40 expands with them in the g33 mode. The g33 mode expansion of the output layer 40 generates a voltage of a first polarity across the output electrodes 44, 45 and 46. When a positive voltage pulse is applied to the second input terminal 63, input layers 150 and 160 contract in the d31 mode. When the input layers 150 and 160 contract in the d31 mode, the attached output layer 40 contracts with them in the g33 mode. The g33 mode contraction of the output layer 40 generates a second output voltage (of opposite polarity than the first output voltage) across the output electrodes 44, 45 and 46. Thus one pair of input layers 140 and 150 pushes the layers 160, 50 and 40 in one direction during the first half cycle of operation and the other pair of input layers 150 and 160 pulls the layers 140, 50 and 40 back during the second half cycle of operation resulting in a 100% duty cycle. Because the center input layer 150 is poled in the same direction as the other input layers 140 or 160 with respect to their shared input electrodes 112 or 113, the central layer 150 may both push and pull the other layers 140 and 160. Thus, the pulsed positive voltage inputs to the input layers 140, 150 and 160 piezoelectrically expand and contract in the d31 mode, and pull and push the output layer 40 in the g33 mode to generate an alternating voltage across the electrodes 44 and 45, and 46 and 45 of the output layer 40.

Whether driving the above-described transformers with an AC voltage input (as the PTs 1 and 3 of FIGS. 5,6 and 8) or applying pulsed DC voltage inputs (as for the two-input terminal PTs 2, 3A and 4 of FIGS. 7, 9 and 10), it is preferable to drive the PTs at their natural resonant frequency. This is because greater deformation of the layers occurs while operating at resonance and therefore, greater voltage gains are realized. Preferably, the PTs are driven at the longitudinal resonant frequency of the input and output layers' longest dimension, in order that the d31 deformation of the input layer(s) may induce a g33 deformation in the output layer 40. Deformation of the output layer 40 in the g33 mode along this longitudinal axis provides the greatest voltage gains because the impedance of the output layer 40 is greatest along that axis. Since the resonant frequency is chosen to be along the longitudinal dimension of the PTs, it is preferred that that dimension correspond to an integral number of half wavelengths of the driving frequency. In other words, each input layer must correspond to an integral multiple of half wavelengths of the driving frequency. Also, each portion of the output layer must correspond to an integral multiple of half wavelengths of the driving frequency. Also, because the longitudinal dimension of the PTs is the longest dimension, the resonant frequency along that dimension corresponds to the lowest driving frequency. Greater deformation and therefore higher voltage gains are associated with the lower frequency deformation. Thus, it is preferred to apply the AC voltage input or the pulsed DC voltage inputs at a frequency corresponding to the natural longitudinal resonant frequency of the PT. A description of suitable drive circuits for applying such voltages follows.

Pulsed Drive Circuit

Figure 11:
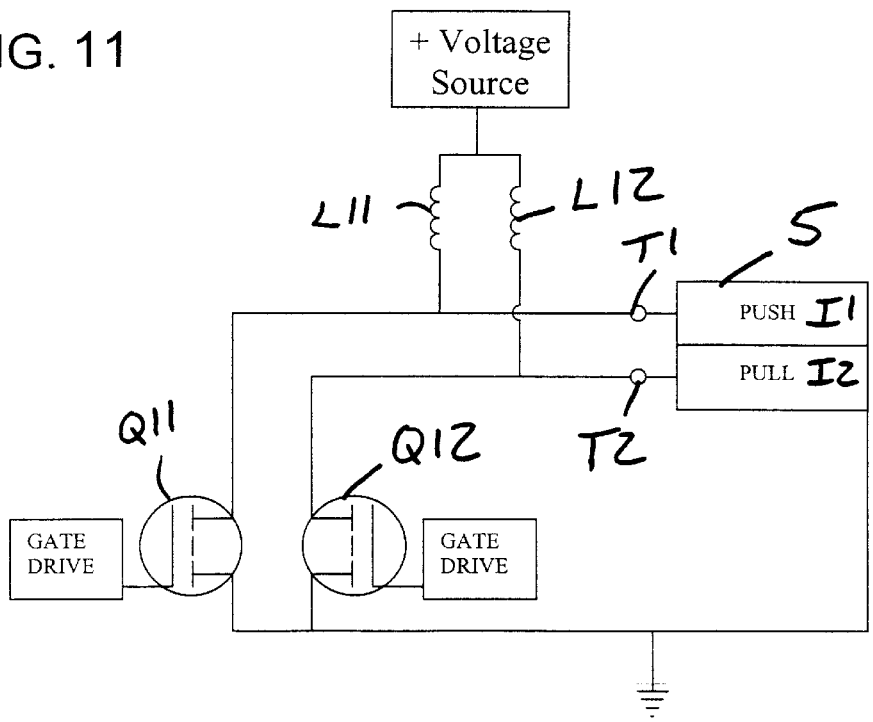
FIG. 11 is a partial schematic of the preferred circuit for applying a pulsed DC input to the two input terminal transformers of FIGS. 7, 9 and 10.

Referring now to FIG. 11: The circuit 6 of FIG. 11 is representative of a simplified circuit for providing the positive input voltage pulses to the push-pull transformers having two input terminals (as in FIGS. 7, 9 and 10). The PT 5 in the circuit 6 represents any of the above described PTs 2, 3A and/or 4 (shown in FIGS. 7, 9 and 10 respectively) which are push-pull transformers having two input terminals. In this circuit 6, the transformer 5 is driven by a circuit 6 containing two inductors L11 and L12 and two FETS Q11 and Q12. Specifically, a positive voltage input is linked to the input electrode(s) connected to one input terminal T1 via an inductor L11. The first input terminal Ti is for applying voltage pulses to a first input section I1 of the transformer 5. The positive voltage input is also linked to the other input electrode(s) connected to a second input terminal T2 via a second inductor L12. The second input terminal T2 is for applying voltage pulses to a second input section I2 of the transformer 5. As illustrated in FIG. 11, section I1 is the section of the transformer 5 that expands or pushes the other sections of the transformer 5 and section I2 is the section of the transformer 5 that contracts or pulls the other sections of the transformer 5. Alternatively, I1 may pull and I2 may push, or input layers of the transformer 5 may overlap in space and function as layer 150 in the transformer 4 of FIG. 10.

A FET is also connected to each input terminal T1 and T2. More specifically, the source of a FET Q11 is electrically connected to inductor L11 and input terminal T1. The drain of the FET Q11 is connected to ground as are the ground wires of the transformer 5. This places the input layer(s) of section I1 of the transformer 5 in parallel with the source and drain of the first FET Q11. Also, the source of a second FET Q12 is electrically connected to inductor L12 and input terminal T2. The drain of the FET Q12 is connected to ground as are the ground wires of the transformer 5. This places the input layer(s) of section I2 of the transformer 5 in parallel with the source and drain of the second FET Q12.

Each FET Q11 and Q12 has a gate drive connected to their respective gates operating such that when the gate of FET Q11 is de-energized, the gate of FET Q12 is energized and when the gate of FET Q12 is de-energized, the gate of FET Q11 is energized. When the gate of the first FET Q11 is energized, current will flow from the source to the drain, storing energy in the inductor L11. When the first FET Q11 is de-energized, the magnetic field in the inductor L11 collapses and a positive voltage pulse is applied to input terminal T1, which causes the first input section I1 to expand, pushing the other layers of the transformer 5. Also, when the gate of the second FET Q12 is energized, current will flow from the source to the drain, storing energy in the inductor L12. When the second FET Q12 is de-energized, the magnetic field in the inductor L12 collapses and a positive voltage pulse is applied to input terminal T2, which causes the second input section I2 to contract, pulling the other layers of the transformer 5. Thus, by alternatingly driving the gates of FETs Q11 and Q12 such that one gate is energized and the other is de-energized, a series of positive voltage pulses may be alternatingly applied to the input sections I1 and I2 of the transformer 5 to drive the transformer 5 in a push-pull mode. This circuit provides a 100% duty cycle for driving the push-pull input sections I1 and I2 of the transformer 5. Furthermore, the drive circuit has to support only half the current resulting in lower losses, greater efficiency and lower cost components.

Inverter Drive Circuit for CCFL

Referring now to FIG. 12: The schematic of FIG. 12 is representative of a circuit for driving one of the above described transformers 5 for lighting a Cold Cathode Fluorescent Lamp (CCFL) 200. The circuit consists essentially of an inverter-based oscillator 230, which drives two N-channel FETs Q6 and Q7 in a half-bridge 260 configuration. The lower FET Q7 is driven through a current buffer 251 and the upper FET Q6 is driven through a level shifter 240 and current buffer 252. The upper FET's Q6 drive circuit is powered by a charge pump 270 that supplies a nominal+12 VDC while the rest of the circuit runs from the +6 VDC supplied externally. The FET half-bridge 260 provides a square-wave drive to the series connection of an inductor L1 and PT 5 which provides a voltage gain and results in a sine-wave at the input of the PT 5 and which powers the CCFL 200. A frequency feedback sub-circuit 280 is provided by current sensing at the low voltage end of the lamp 200 which helps to reduce power losses by eliminating special taps on the PT 5.

Figure 13:
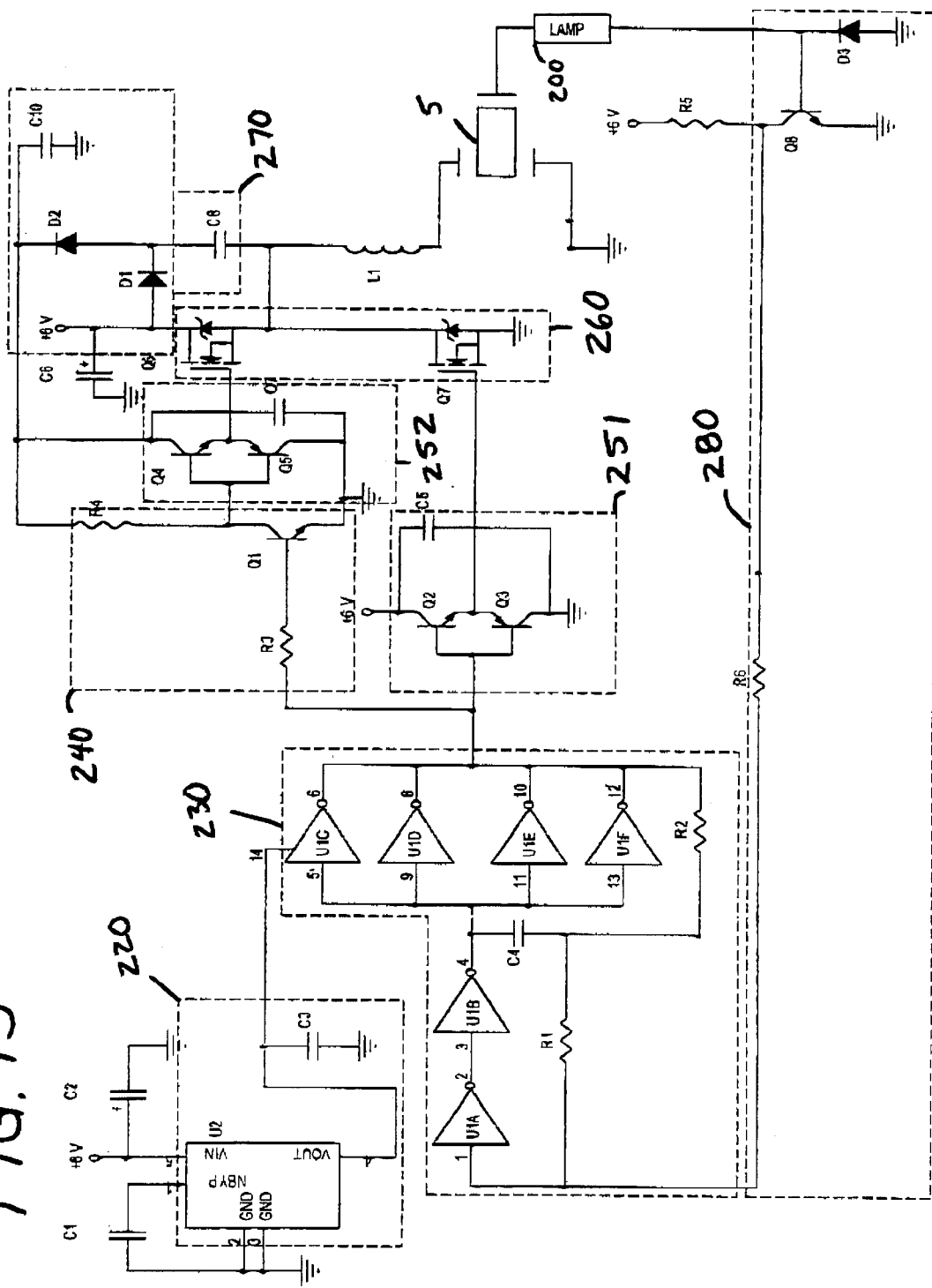
FIG. 13 is a circuit diagram showing one embodiment of the circuit of FIG. 12.

Referring now to FIG. 13: In this circuit 7, voltage is applied to the oscillator 230 from a suitable voltage source 210 and a voltage regulator 220. The voltage input 210 ranges, for example, from +6 to 15 volts DC and is input to a voltage regulator chip U2. The output signal of the voltage regulator 220 is an input signal to the oscillator chip U1 of the oscillator section 230. The voltage regulator section 220 comprises not only voltage regulator chip U2, but also several grounded capacitors C1, C2 and C3 that may be attached as filters on the input and output sides of the voltage regulator chip U2 to provide a stable output signal.

The oscillator section 230 comprises a three stage inverter-based oscillator constructed with a hex CMOS inverter U1. The output stage of the oscillator 230 uses four of the inverters U1C, U1D, U1E and U1F in parallel to reduce loading effects of the circuitry that follows. The input and feedback stages of the oscillator 230 are used to determine the oscillator frequency and comprises in part a series combination of resistor R2 and capacitor C2 connected in parallel with the four inverters U1C, U1D, U1E and U1F. The input and feedback stages of the oscillator 230 also comprise resistor R1, which is connected on one side to the junction of C2 and R2 and the other side to one of the remaining inverters U1A in the oscillator chip U1, which is connected in series with remaining inverter U1B and the parallel inverters U1C, U1D, U1E and U1F. This provides for the series connected capacitor C4 and resistor R1 connected in parallel with the series connected inverters U1A and U1B, which commute the effect of the RC time constant established by R2 and C4 to the parallel inverters U1C, U1D, U1E and U1F. Thus, when the feedback capacitor C4 is fully charged, the voltage then follows resistor R1, which is input to inverters U1A and U1B. The output of the series connected inverters U1A and U1B completes the feedback path and provides a faster, cleaner switching signal to the input side of the four parallel inverters U1C, U1D, U1E, and U1F. To determine or adjust the initial oscillator frequency, a potentiometer may be used in place of the resistor R2, which may then be replaced with fixed resistor R2 after the circuit is adjusted to the open circuit resonant frequency of the PT 5. The output of the oscillator section 230 is a square wave oscillating between ground and a positive voltage of 6–15 VDC.

Figure 14:
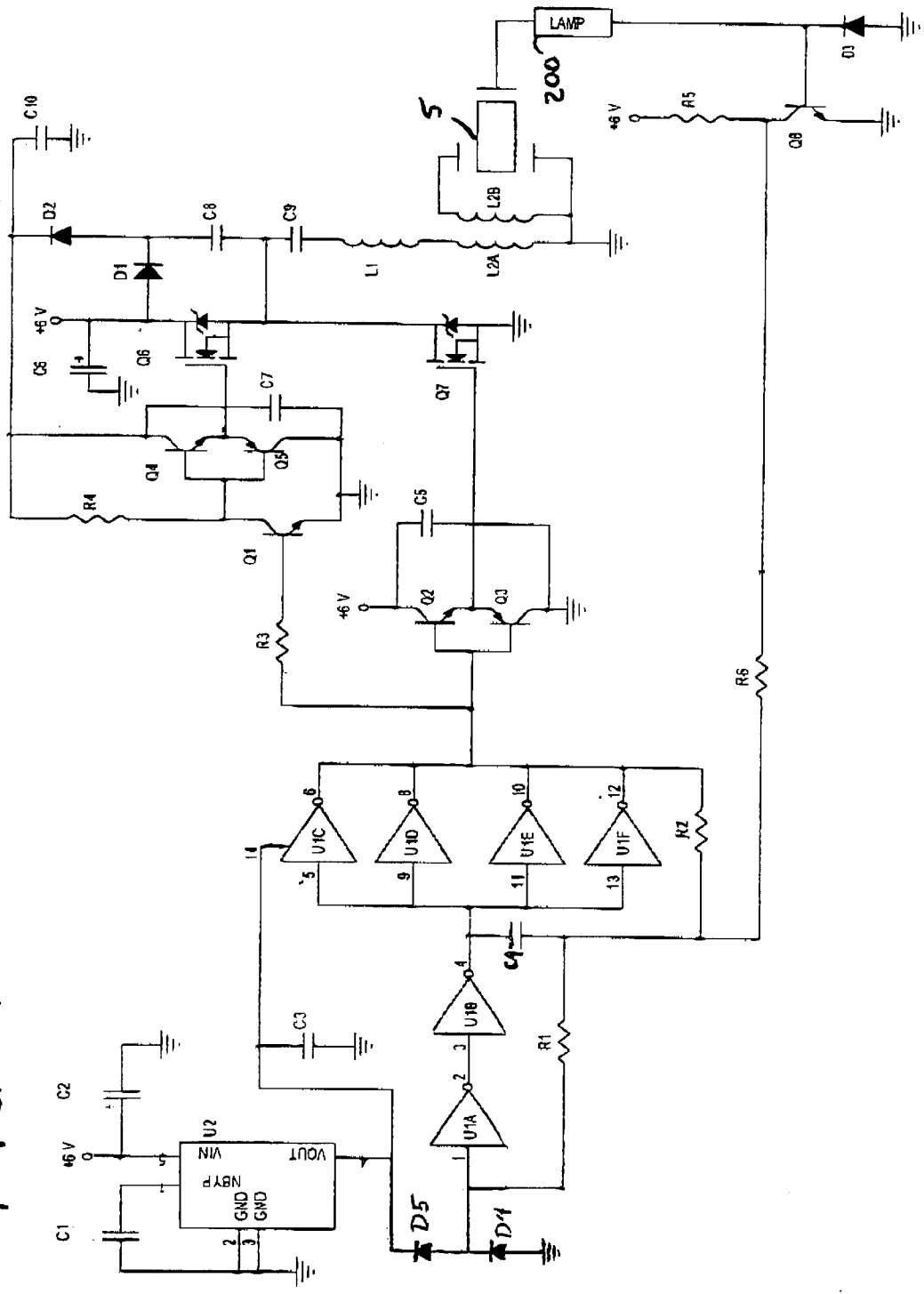
FIG. 14 is a circuit diagram showing an alternate embodiment of a circuit of FIG 12.

Referring to FIG. 14: Optionally, diodes D4 and D5 may also be attached to the input side of the oscillator section 230 at the input inverter U1A, to provide for transient voltage protection. More specifically, a diode D4 having a grounded cathode and having its anode series connected to the cathode of a second diode D5 which has its anode connected to the voltage regulator 220 output. The junction of the two diodes D4 and D5 is connected to the input of the first inverter U1A. High negative voltages are grounded through diode D4 and high positive voltages are routed through diode D5 to the output of the regulator U2 and filtered by capacitor C3 before being input to the inverter array U1. This prevents high transient voltages from damaging the inverters of the array.

Referring again to FIG. 13: The output of the oscillator 230 is connected (through current buffers 251 and 252 and a level shifter 240) to a half-bridge section 260 comprising two series connected FETs Q6 and Q7. More specifically, the half-bridge section 260 preferably comprises two, stacked N-channel FETs Q6 and Q7. In this configuration the drain of one FET (the lower FET) Q7 is connected to source the of the other FET (the upper FET) Q6. The source of the lower FET Q7 is ground referenced and the drain of the upper FET Q6 has a positive voltage bias (preferably +6–15 volts) and is also connected the charge pump section 270. The upper half of the bridge 260 is driven out of phase with the lower half of the bridge 260 such that when the upper FET Q6 is on, the lower FET Q7 is off, and conversely, when the upper FET Q6 is off, the lower FET Q7 is on. The half-bridge 260 is driven by the oscillator 230 at approximately 50% duty cycle. Driven in this manner, the output of the half-bridge section 260 taken at the drain-source junction of the lower and upper FETs Q7 and Q6 consists of a square wave voltage, going from 0 to +6–15 VDC.

As mentioned above, the half bridge section 260 is driven through dual current buffers 251 and 252 and a level shifter 240. The current buffer sections 251 and 252 provide for fast transitions while switching. The gate of the lower FET Q7 is connected to a first current buffer section 251 and the gate of the upper FET Q6 is connected to a second current buffer section 252 preceded by a level shifter section 240. The current buffers 251 and 252 are provided by two, stacked bipolar transistors (BJTs) operated as emitter followers. More specifically, the first current buffer section 251 comprises two BJTs Q2 and Q3 in a parallel configuration, i.e., having their respective bases and emitters electrically connected to each other. Also, the first BJT's Q2 collector is positively biased with a +6–15 VDC and is connected through capacitor C5 to the second BJT's Q3 collector which is ground referenced. The junction of the BJTs' Q2 and Q3 emitters is electrically connected to the gate of the lower FET Q7 in the half-bridge section 260.

The second current buffer section 252 also comprises two BJTs Q4 and Q5 in a parallel configuration, i.e., having their respective bases and emitters electrically connected to each other. Likewise, the first BJT's Q4 collector is positively biased with a +6–15 VDC and is connected through a capacitor C7 to the second BJT's Q5 collector, which is ground referenced. The junction of the BJTs' Q4 and Q5 emitters is electrically connected to the gate of the upper FET Q6 in the half-bridge section.

The operation of the current buffer sections 251 or 252 is as follows: The output signal of the oscillator section 230 is a square wave oscillating between ground and a positive voltage. When the positive voltage is applied for example, to the bases of the BJTs Q2 and Q3 of the lower current buffer 251, the base of BJT Q2 conducts. When the base of BJT Q2 is conducting, capacitor C5 discharges through the collector to the emitter of the BJT Q2, quickly energizing the gate of the lower FET Q7 of the half-bridge section 260. When the ground signal is applied to the bases of the BJTs Q2 and Q3 of the lower current buffer 251, the base of BJT Q3 conducts. When the base of BJT Q3 is conducting, the gate of the lower FET Q7 of the half-bridge section is connected to ground through the collector and the emitter of the BJT Q3 which quickly de-energizes the gate of the lower FET Q7 of the half-bridge section 260. The upper current buffer 252 components (Q4, Q5 and C7) work in conjunction with the upper FET Q6 of the half-bridge section 260 in a similar manner to but out of phase with the lower current buffer 251. This is because additional components (the level shifter 240 and charge pump 270, discussed later) allow the upper current buffer 252 to drive the upper FET Q6 out of phase with the lower FET 7. The current buffer sections 251 and 252 configured in such a manner provide for fast transitions while switching.

As mentioned above, the second current buffer 252 is preceded by a level shifter section 240. The level shifter section 240 consists of two resistors R3 and R4 and a BJT Q1. The BJT Q1 is driven in a common emitter (open collector) mode as a saturated inverting switch. This inversion is needed to drive the upper half of the bridge 260 out of phase with the lower half of the bridge 260. The base of the BJT Q1 is connected to the oscillator 220 output through the first resistor R3 and the collector of the BJT Q1 is connected to the charge pump section 270 through the second resistor R4. The emitter of the BJT Q1 is connected to ground. The first resistor R3 limits the current into the base of the BJT Q1 and reduces the load effects on the oscillator 230. The second resistor R4 pulls up the collector to +12 VDC when the BJT Q1 is not conducting. This gives a gate to source voltage of about six volts to turn on the upper half of the bridge 260. Thus, when the output of the oscillator array 230 is a positive voltage, the BJT Q1 of level shifter 240 conducts to ground, pulling open the gate of BJT Q5 of the second current buffer 252 which connects the gate of the upper FET Q6 of the half bridge 260 to ground. This quickly de-energizes the gate of the upper FET Q6, while the gate of the lower FET Q7 is energized. Conversely, when the output of the oscillator array 230 goes to ground, the BJT Q1 of level shifter 240 does not conduct and the second resistor R4 of the level shifter 240 pulls up the collector to +12 VDC. This provides a gate to source voltage through BJT Q4 of the upper current buffer 252 of about six volts to turn on the upper FET Q6 of the bridge 260. This quickly energizes the gate of the upper FET Q6, while the gate of the lower FET Q7 is de-energized.

The +12 VDC provided to the level shifter 240 and upper current buffer 252 is rovide by a charge pump section 270. The charge pump section 270 consists of two diodes D1 and D2, and two capacitors C8 and C10. More specifically, a first diode D1 and a first capacitor C8 are connected in parallel with the upper FET Q6 of the half-bridge 260, with the first diode D1 input being connected to the upper FET's Q6 drain and the first capacitor being connected to the source of the upper FET Q6, i.e., the output of the half-bridge 260. The drain of the upper FET Q6 is positively biased with +6–15 VDC. A second diode D2 is connected to the junction of the first diode D1 output and the first capacitor C8. The output side of the second diode D2 is connected to a grounded capacitor C10 as well as to resistor R4 of the level shifter 240 and the collector of BJT Q4 of the second current buffer 252. The output of the half-bridge 260 at the junction with capacitor C8 is cyclically forced from +6–15 VDC to 0 VDC and back to +6–15 VDC. Each cycle that lower FET Q7 is on the junction is at 0 VDC and the capacitor C8 is charged to, for example +6 VDC through diode D1. Then when upper FET Q6 is on, the junction is forced to +6 VDC which adds to the voltage already stored in capacitor C8 to charge capacitor C10 to +12 VDC through D2. This +12 VDC on C10 is used by BJT Q1 of the level shifter 240 and BJT Q4 of the current buffer 252.

The square-wave output of the half-bridge section 260 is used to drive an inductor-PT combination. The inductor L1 is connected on one end between the half-bridge 260 and the capacitor C8, and on the other end to an input of the PT 5. The other input of the PT 5 is connected to ground. The combination of the inductor's L1 inductance and the capacitance of the PT 5 forms a series resonant circuit that has the same resonant frequency as the mechanical resonant frequency of the PT 5. This results in a sine-wave at the input of the PT 5, which results in higher efficiency operation of the PT 5 while achieving some voltage gain at the output of the PT 5 as well.

The high voltage end of the lamp 200 (a gas discharge lamp, and more preferably a Cold Cathode Fluorescent Lamp (CCFL)) is connected to the high voltage output of the PT 5 and the low voltage end of the lamp 200 is grounded through the parallel connection of a feedback transistor Q8 and diode D3. Current sensing can be added here, if required. The transistor Q8 is configured in a common emitter open collector configuration that is turned on and off each cycle. The resulting square-wave output of the transistor Q8 is phase shifted and modified by R6. This waveform is summed with the feedback in the oscillator at the junction of R1 and U1A, as in FIG. 13, or alternatively at the junction of C4 and R2, as in FIG. 14. This results in the inverter oscillations being synchronized to the natural resonant frequency of the PT 5, which compensates for variations due to the temperature or the load.

Referring again to FIG. 14: If additional voltage gain is needed a tapped inductor L2 (L2A and L2B) may be used in conjunction with an additional capacitor C9 to prevent saturation. Each side L2A and L2B of the tapped inductor L2 is connected each input of the transformer 5 and the center tap of the inductor L2 is connected to the first inductor L1, while the capacitor C9 is connected between the first inductor L1 and the output of the half bridge section 260. However, if the PT 5 has enough gain for the application then the additional capacitor C9 and center-tapped inductor L2 are not needed.

While the above description contains many specificities, these should not be construed as limitations on the scope of the invention, but rather as exemplification of preferred embodiments thereof. Many other variations are possible, for example:

While in the preferred embodiment of the invention the ceramic layers are preferably constructed of a PZT ceramic material, other electroactive materials may be used in its place;

The ceramic layers can be piezoelectric, ferroelectric or other electroactive elements;

The input portion may comprise as few as one ceramic layer or may be of a multi-layer construction;

The shape of the TMPT need not be rectangular bar-shaped, and many other shapes or configurations are possible;

The direction of polarization of the input layers can vary and need not be toward the central electrode, but may be away from the central electrode or combinations thereof;

The direction of polarization of the output layer need not be toward from the central electrode, but may be away the central electrode;

The central electrode of the output layer need not be the high voltage electrode—the outer electrodes may carry the high voltage and the central electrode may be ground referenced;

The insulating layer need not be constructed of alumina, but may be constructed of other insulating materials; and The insulating layer need not extend to the edges or past the edges, but may simply be large enough to isolate the high voltage electrode from the input or ground electrodes.

Accordingly, the scope of the invention should be determined not by the embodiment illustrated, but by the appended claims and their legal equivalents.

I claim:

1. A circuit for producing an alternating current, comprising:
   a power source;
   an oscillator array having an input side and an output side;
      said power source being connected to said input side of said oscillator array;
   a first current buffer having an input side and an output side;
   said input side of said first current buffer being connected to said output side of said oscillator array;
   a level shifter having an input side and an output side;
      said input side of said level shifter being connected to said output side of said oscillator array in parallel with said first current buffer;
   a second current buffer having an input side and an output side;
      said input side of said second current buffer being connected in series with said output side of said level shifter;
   a FET half-bridge comprising a first FET and a second FET;
      a drain of said first FET being connected by an output conductor of said FET half-bridge to a source of said second FET;
      a gate of said first FET being connected to said output side of said first current buffer;
      a gate of said second FET being connected to said output side of said second current buffer;
   an inductor having an input side and an output side;
      said input side of said inductor being connected to said output conductor of said FET half-bridge; and
   a piezoelectric transformer having a first input terminal, a grounded second input terminal and an output terminal;
      said first input terminal being connected to said output side of said inductor.

2. The circuit according to claim 1, further comprising;
   a charge pump having an input side and an output side;
      said input side of said charge pump being connected to said output conductor of said FET half-bridge;
      said input side of said charge pump being connected to a drain of said second FET in said half-bridge;
      said output side of said charge pump being connected to said level shifter; and
      said output side of said charge pump being connected to said second current buffer.

3. The circuit according to claim 2,
   wherein said oscillator array comprises an inverter array; and wherein an output signal of said oscillator array comprises an electrical signal oscillating between a ground value and a positive value.

4. The circuit according to claim 3,
   wherein said oscillator array further comprises a first resistor in series with a first capacitor;
      said first resistor and said first capacitor being connected in parallel with a first inverter of said inverter array.

5. The circuit according to claim 4,
   wherein said oscillator array further comprises:
   a second inverter of said inverter array connected in series with said first inverter; and
   a second resistor connected in series with said first capacitor;
      said second resistor and said first capacitor being connected in parallel with second inverter.

6. The circuit according to claim 5,
   wherein said level shifter further comprises:
   a first BJT;
      said first BJT being a PNP type BJT having a collector connected to said input side of said second current buffer;
      said first BJT having an emitter connected to ground;
   a third resistor connected in series between said output side of said oscillator array and a base of said first BJT; and
   a fourth resistor connected in series between said output side of said charge pump and said collector of said first BJT.

7. The circuit according to claim 6,
   wherein said first current buffer further comprises:
   a second capacitor having first and second sides;
   a second positive voltage source;
   a second BJT;
      said second BJT being a NPN type BJT having a base connected to said output side of said oscillator array;
      said second BJT having a collector connected to said first side of said second capacitor;
      said second BJT having said collector connected to said second positive voltage source; and
   a third BJT;
      said third BJT being a PNP type BJT having a base connected to said output side of said oscillator array;
      said third BJT having a collector connected to said second side of said second capacitor;
      said third BJT having said collector connected to ground;
      said output side of said first current buffer being at a junction of an emitter of said third BJT with an emitter of said second BJT.

8. The circuit according to claim 7,
   wherein said second current buffer further comprises:
   a third capacitor having first and second sides;
   a fourth BJT;
      said fourth BJT being a NPN type BJT having a base connected to said collector of said first BJT;
      said fourth BJT having a collector connected to said first side of said third capacitor;
      said fourth BJT having said collector connected to said output side of said charge pump; and
   a fifth BJT;
      said fifth BJT being a PNP type BJT having a base connected to said collector of said first BJT;
      said fifth BJT having a collector connected to said second side of said third capacitor;
      said fifth BJT having said collector connected to ground;
   said output side of said second current buffer being at a junction of an emitter of said fifth BJT and an emitter of said fourth BJT.

9. The circuit according to claim 8,
   wherein said charge pump further comprises:
   a first diode having a cathode connected to a drain of said second FET in said half-bridge;
   a third positive voltage source connected to said drain of said second FET in said half-bridge;
   a fourth grounded capacitor having an ungrounded side connected to said fourth resistor and to said collector of said fourth BJT;
   a second diode having an anode connected to said ungrounded side of said fourth capacitor and having a cathode connected to an anode of said first diode; and a fifth capacitor having a first side and a second side;
   said first side of said fifth capacitor being connected to said output side of said half-bridge and to said input side of said inductor;
   said second side of said fifth capacitor being connected to said cathode of said second diode.

10. The circuit according to claim 9, further comprising:
a gas discharge lamp having a high voltage side and a low voltage side;
   said high voltage side of said gas discharge lamp being connected to said output side of said piezoelectric transformer; and
   said low voltage side of said gas discharge lamp being connected to ground.

11. The circuit according to claim 10, further comprising:
a feed back subcircuit connected between said low voltage side of said gas discharge lamp and said input side of said oscillator array.

12. The circuit according to claim 11, wherein said feedback subcircuit comprises:
   a third diode having a grounded cathode and having an anode connected to said low voltage side of said gas discharge lamp;
   a sixth BJT having a base connected to said anode of said third diode and to said low voltage side of said gas discharge lamp;
   a positive voltage source connected to a collector of said sixth BJT; and
   a fifth resistor having first and second sides;
      said first side of said fifth resistor being connected to said collector of said sixth BJT;
      said second side of said fifth resistor being connected to said input side of said oscillator array.

13. The circuit according to claim 12,
wherein said oscillator array further comprises a third inverter of said inverter array connected in parallel with said first inverter.

14. The circuit according to claim 13,
wherein said oscillator array further comprises a fourth inverter of said inverter array connected in series between said second inverter and said first and third parallel inverters.

15. The circuit according to claim 14,
wherein said second side of said fifth resistor is connected to said input side of said oscillator array between said second resistor and said second inverter.

16. The circuit according to claim 14,
wherein said second side of said fifth resistor is connected to said input side of said oscillator array between said first resistor and said first capacitor.

17. The circuit according to claim 1, wherein said piezoelectric transformer comprises:
   a first input electroactive layer having first and second opposing electroded major faces an d first and second opposing minor faces and polarized such that upon application of voltage across said first and second opposing electroded major faces,
   said first input electroactive layer deforms in a longitudinal direction parallel to said first and second opposing electroded major faces and perpendicular to said first and second opposing minor faces;
   an output electroactive layer having first and second opposing major faces, first and second opposing electroded minor faces, third and fourth opposing minor faces, and a central output electrode bonded to said output electroactive layer between said first and second opposing electroded minor faces;
      said output electroactive layer having a first output portion between said central output electrode and said first electroded minor face, said first output portion being polarized in a direction normal to said first electroded minor face;
      said output electroactive layer having a second output portion between said central output electrode and said second electroded minor face, said second output portion being polarized in a direction normal to said second electroded minor face; and
   a dielectric layer having first and second opposing major faces;
      said first major face of said dielectric layer being bonded to said first electroded major face of said input electroactive layer;
      said second major face of said dielectric layer being bonded to said first major face of said output electroactive layer.

18. The circuit according to claim 17, wherein said piezoelectric transformer further comprises:
   a second input electroactive layer having first and second opposing electroded major faces and polarized such that upon application of a voltage is across said first and second opposing electroded major faces, said second input electroactive layer deforms in said longitudinal direction parallel to said first and second opposing major faces;
   said first electroded major face of said second input electroactive layer being bonded to said second electroded major face of said first input electroactive layer.

* * * * *